(12) United States Patent
Noemaun et al.

(10) Patent No.: US 12,148,789 B2
(45) Date of Patent: Nov. 19, 2024

(54) STACKS OF ELECTRICALLY RESISTIVE MATERIALS AND RELATED SYSTEMS AND APPARATUSES

(71) Applicant: Micron Technology, Inc., Boise, ID (US)

(72) Inventors: Ahmed N. Noemaun, Boise, ID (US); Durga P. Panda, Boise, ID (US)

(73) Assignee: Micron Technology, Inc., Boise, ID (US)

(*) Notice: Subject to any disclaimer, the term of this patent is extended or adjusted under 35 U.S.C. 154(b) by 650 days.

(21) Appl. No.: 17/214,322

(22) Filed: Mar. 26, 2021

(65) Prior Publication Data

US 2022/0310775 A1  Sep. 29, 2022

(51) Int. Cl.
*H01C 10/00* (2006.01)
*H01C 1/14* (2006.01)
(Continued)

(52) U.S. Cl.
CPC .............. *H01L 28/20* (2013.01); *H01C 1/14* (2013.01); *H01C 10/00* (2013.01); *H01L 21/308* (2013.01);
(Continued)

(58) Field of Classification Search
None
See application file for complete search history.

(56) References Cited

U.S. PATENT DOCUMENTS

| 6,150,227 A * | 11/2000 | Kinoshita ............... H01L 28/20 29/610.1 |
| 2006/0110936 A1* | 5/2006 | Hill ................... H01L 21/02216 257/E21.271 |

(Continued)

FOREIGN PATENT DOCUMENTS

| CN | 212342634 U * | 1/2021 |
| KR | 10-2013-0070153 A | 6/2013 |

(Continued)

OTHER PUBLICATIONS

English translation of CN 212342634 U (Year: 2021).*
(Continued)

*Primary Examiner* — Sue A Purvis
*Assistant Examiner* — Carnell Hunter, III
(74) *Attorney, Agent, or Firm* — TraskBritt

(57) ABSTRACT

Stacks of electrically resistive materials and related apparatuses, electrical systems, and methods are disclosed. An apparatus includes one or more resistor devices including a substrate, first and second electrically resistive materials, and an electrically insulating material between the first and second electrically resistive materials. The substrate includes a semiconductor material. A stepped trench is defined in the substrate by sidewalls and horizontal surfaces of the semiconductor material. The first electrically resistive material and the second electrically resistive material are within the stepped trench. A method of manufacturing a resistor device includes forming a stepped trench in the substrate, forming an etch stop material within the stepped
(Continued)

trench, disposing an electrically resistive material within the stepped trench, disposing an electrically insulating material on the electrically resistive material, and repeating the disposing the electrically resistive material and the disposing the electrically insulating material operations a predetermined number of times.

24 Claims, 17 Drawing Sheets

(51) Int. Cl.
*H01L 21/308* (2006.01)
*H01L 21/31* (2006.01)
*H01L 21/3205* (2006.01)
*H01L 49/02* (2006.01)

(52) U.S. Cl.
CPC ........ *H01L 21/31* (2013.01); *H01L 21/32055* (2013.01)

(56) References Cited

U.S. PATENT DOCUMENTS

| | | | |
|---|---|---|---|
| 2008/0185678 A1* | 8/2008 | Kitajima | H01L 28/20 257/529 |
| 2011/0062508 A1 | 3/2011 | Park et al. | |
| 2014/0054669 A1 | 2/2014 | Sel et al. | |
| 2015/0382403 A1* | 12/2015 | Philip | H05B 3/12 219/541 |
| 2019/0037646 A1* | 1/2019 | Chaffins | H05K 1/16 |
| 2020/0394501 A1 | 12/2020 | Chen | |
| 2022/0293140 A1* | 9/2022 | Lendvay | G11C 29/06 |

FOREIGN PATENT DOCUMENTS

KR 10-2016-0069596 A 6/2016
TW 1755083 B * 2/2022

OTHER PUBLICATIONS

English translation of TW I755083 B (Year: 2022).*
International Search Report for International Application No. PCT/US2022/017303, mailed Jun. 7, 2022, 4 pages.
International Search Report for International Application No. PCT/US2022/017303, mailed Jun. 7, 2022, 5 pages.

* cited by examiner

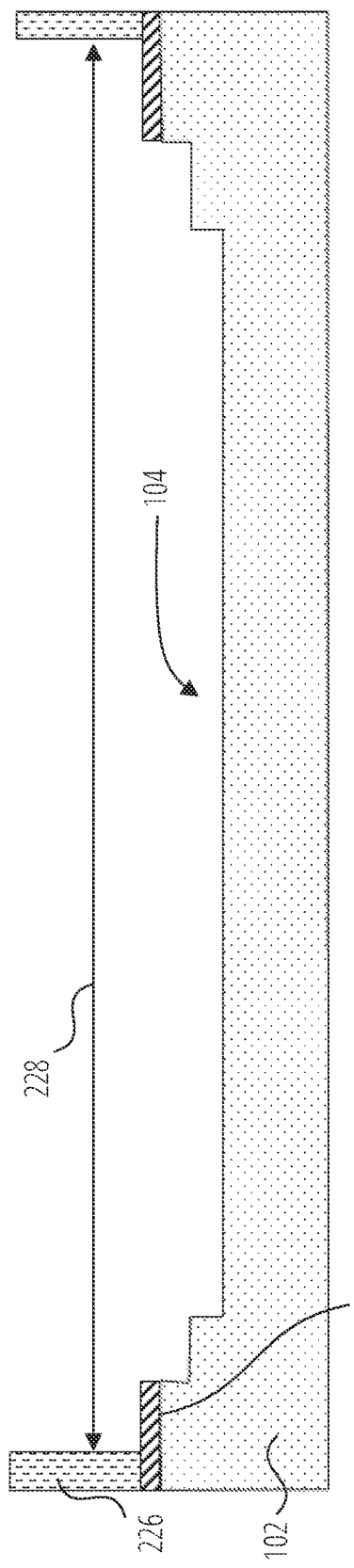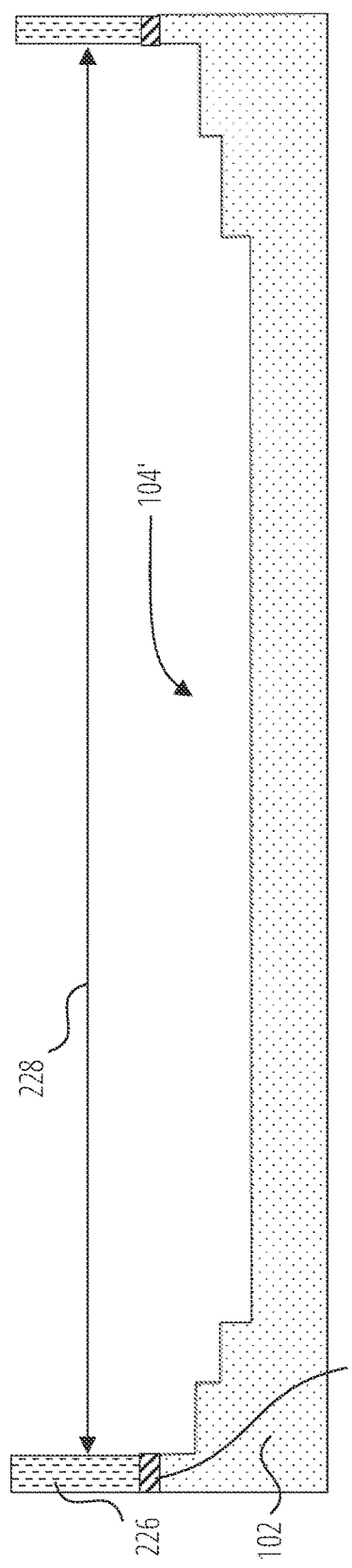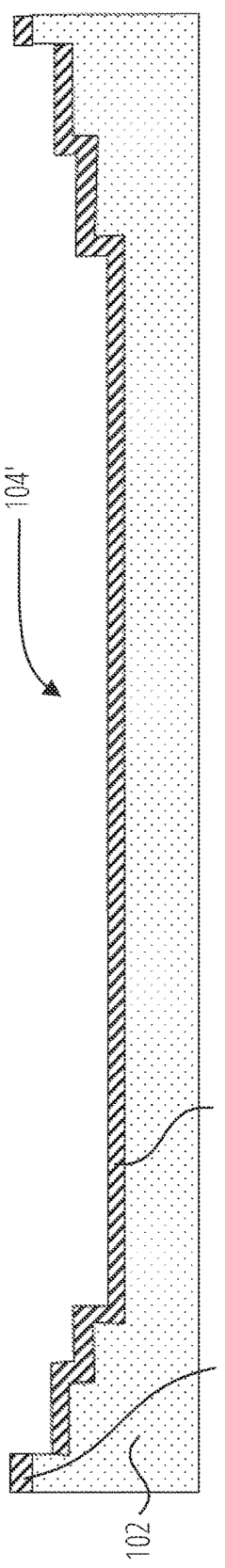

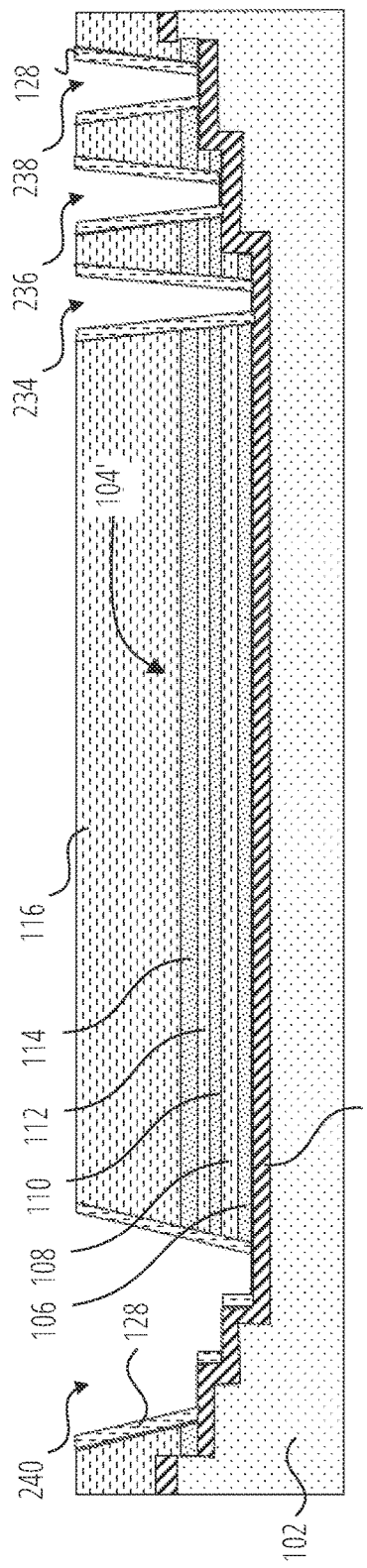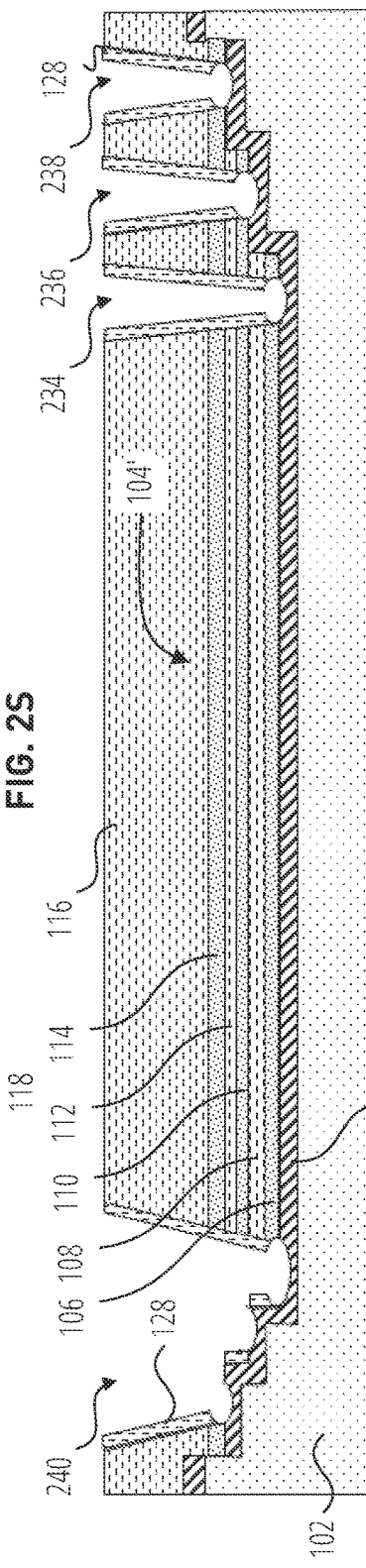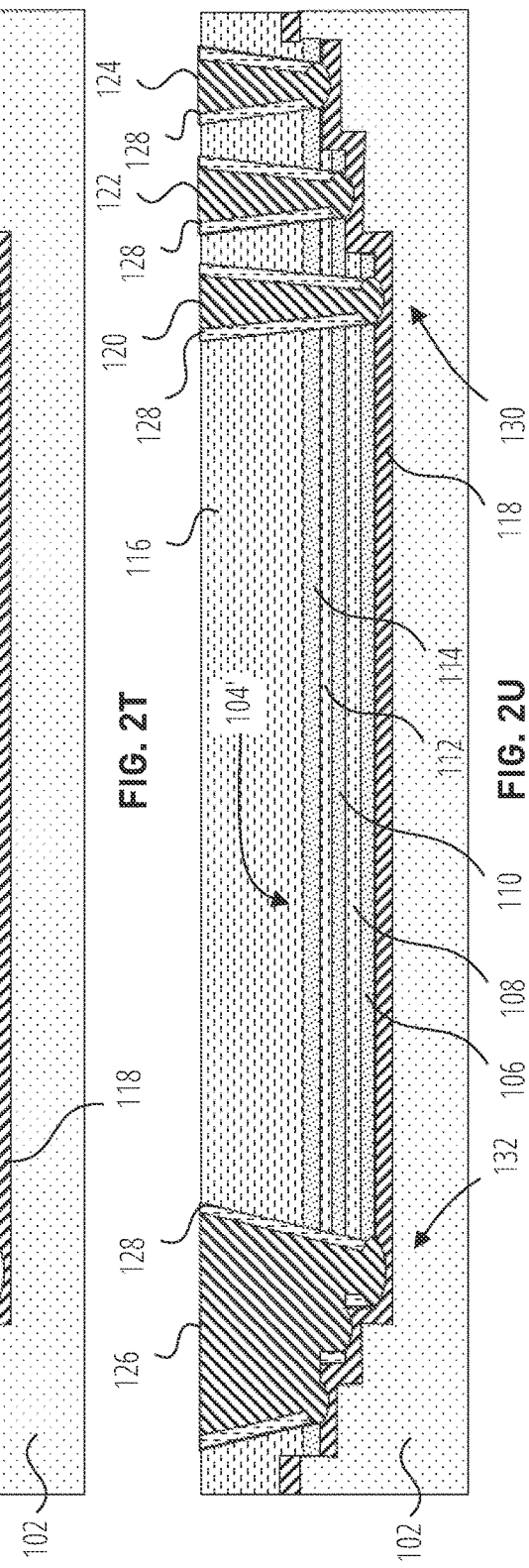

STACKS OF ELECTRICALLY RESISTIVE MATERIALS AND RELATED SYSTEMS AND APPARATUSES

TECHNICAL FIELD

This disclosure relates generally to compact resistor devices for use in semiconductor devices, and more specifically to stacks of electrically resistive materials to implement resistor devices.

BACKGROUND

Resistors including polysilicon may be used in various electrical circuits including, among many others, digital to analog convertors, regulators, and temperature compensation circuits.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
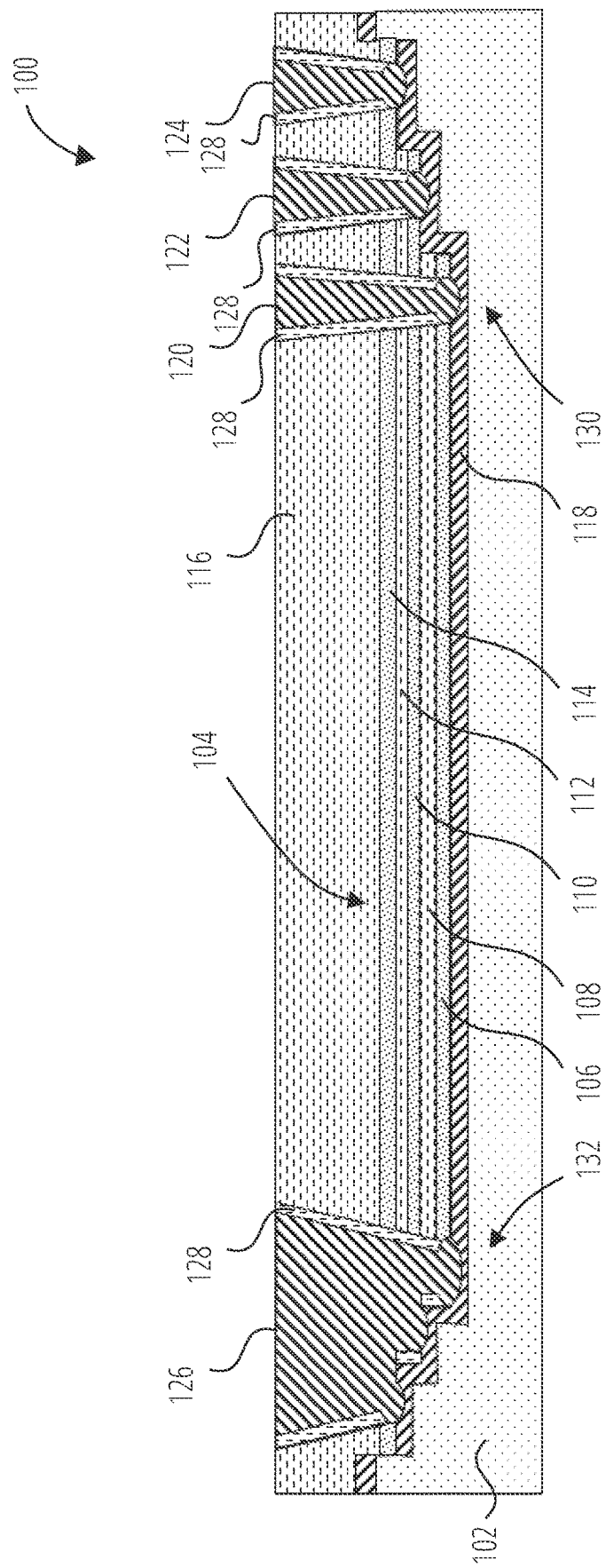
FIG. 1 is a longitudinal cross-section of a resistor device, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the term "semiconductor material" refers to a material having a conductivity between those of electrically insulating materials and electrically conductive materials. For example, a semiconductor material may have a conductivity of between about $10^{-8}$ Siemens per centimeter (S/cm) and $10^4$ S/cm at room temperature (e.g., between about twenty degrees centigrade and about twenty-five degrees centigrade). Examples of semiconductor materials include elements found in column IV of the period table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_XGa_{1-X}As$), and quaternary compound semiconductor materials (e.g., $Ga_XIn_{1-X}As_YP_{1-Y}$), without limitation. Compound semiconductor materials may include combinations of elements from columns III and V of the period table of elements (III-V semiconductor materials) or from columns II and VI of the period table of elements (II-VI semiconductor materials), without limitation. Semiconductor devices often include crystalline semiconductor materials. By way of non-limiting examples, transistors and diodes include crystalline semiconductor materials.

As used herein, the term "monocrystalline semiconductor material" refers to a semiconductor material including particles (e.g., atoms, molecules) that are arranged in a substantially continuous crystal lattice that is substantially free of grain boundaries within the semiconductor material. A substrate of a semiconductor material may include a monocrystalline semiconductor material such as single-crystal silicon. A substrate including monocrystalline semiconductor material may serve as a substrate material for various devices and structures disclosed herein.

As used herein, the term "polycrystalline semiconductor material" refers to a semiconductor material including multiple crystals, sometimes known as crystallites or grains, of the semiconductor material. In contrast with monocrystalline semiconductor material, polycrystalline semiconductor material includes grain boundaries within the semiconductor material. Polycrystalline silicon, which is also known as "polysilicon" and "poly," is an example of a polycrystalline semiconductor material.

As used herein, the term "intrinsic semiconductor material" refers to a semiconductor material having a relatively small density of impurities (e.g., a lower density of impurities than electron and hole densities resulting from thermal generation at room temperature).

As used herein, the term "doped semiconductor material" refers to a semiconductor material having a higher concentration of impurities (e.g., dopants) introduced thereto than intrinsic semiconductor materials (e.g., a higher concentration of impurities than electron and hole concentrations resulting from thermal generation at room temperature). A doped semiconductor material may be doped predominantly with donor impurities such as phosphorus (P), antimony (Sb), bismuth (Bi), or arsenic (As), without limitation. Each donor impurity in a crystal lattice of semiconductor material adds a free electron, which increases the conductivity of the semiconductor material relative to the intrinsic form of the semiconductor material. Doped semiconductor materials that have been doped predominantly with donor impurities are referred to herein as "N-type semiconductor materials." A doped semiconductor may instead be doped predominantly with trivalent or acceptor impurities such as boron (B), indium (In), aluminum (Al), and gallium (Ga), without limitation. Each trivalent or acceptor impurity in a crystal lattice of semiconductor material adds an electron hole (referred to herein as "hole"), which increases the conductivity of the semiconductor material relative to the intrinsic form of the semiconductor material. Doped semiconductor materials that have been doped predominantly with trivalent or acceptor impurities are referred to herein as "P-type semiconductor materials."

As used herein, the terms "vertical" and "horizontal" refer to directions that are substantially perpendicular and parallel, respectively, to a surface of a substrate on or in which semiconductor devices are formed. For example, a "vertical" stack of materials or a "vertically oriented" stack of materials on a substrate refers to a stack of materials in which a first material is between the substrate and a second material, the first material and the second material are between the substrate and the third material, and so on so that each successive material is further from the substrate than the previous material. By contrast, a "horizontal" stack of materials or a "horizontally oriented" stack of materials refers to a stack of materials in which boundaries between the materials are each substantially the same distance from the substrate.

Polycrystalline semiconductor materials are used in various semiconductor devices. For example, polycrystalline semiconductor materials may be used for resistors in semiconductor devices. A resistance of a polycrystalline semiconductor resistor may be estimated based at least on a length, a cross-sectional area, and a dopant concentration of the polycrystalline semiconductor material. As a result, a polycrystalline semiconductor material may be an example of an "electrically resistive material." As used herein, the term "electrically resistive material" refers to a material that is intended for use as an electrically resistive element of a resistor in an electronic device (e.g., an apparatus, a semiconductor device).

A serpentine pattern of a polycrystalline semiconductor resistor may be used to provide a desired length of the polycrystalline semiconductor material within a limited semiconductor chip area to achieve a desired resistance value. These resistors are sometimes known as serpentine resistors due to their meandering pattern, which may resemble a serpent. A serpentine pattern may occupy a relatively large area of a semiconductor chip, which may reduce availability of the semiconductor chip area for other devices.

Embodiments disclosed herein include resistor devices including stacks of electrically resistive material to reduce the amount of semiconductor chip area occupied by resistors. The electrically resistive materials in the stack may reduce or eliminate serpentine patterns over the semiconductor chip area to reduce chip area occupied by the electrically resistive materials. By way of example only, the chip area occupied by the electrically resistive materials may be reduced by about two-thirds.

In some embodiments an apparatus includes one or more resistor devices. The one or more resistor devices include a substrate including a semiconductor material. A stepped trench is defined in the substrate by sidewalls and horizontal surfaces of the semiconductor material. The resistor device also includes a first electrically resistive material within the stepped trench, a second electrically resistive material within the stepped trench, and an electrically insulating material between the first electrically resistive material and the second electrically resistive material.

In some embodiments an apparatus includes one or more resistor devices. The one or more resistor devices include a first electrically resistive material vertically adjacent to a semiconductor material, and a second electrically resistive material vertically adjacent to the first electrically resistive material. The first electrically resistive material is between the substrate and the second electrically resistive material.

In some embodiments a method of manufacturing a resistor device includes forming a stepped trench in a substrate, forming an etch stop material within the stepped trench, disposing an electrically resistive material within the stepped trench, disposing an electrically insulating material on the electrically resistive material, and repeating the disposing the electrically resistive material and the disposing the electrically insulating material operations a predetermined number of times.

In some embodiments an electrical system includes a variable resistor and a controller. The variable resistor includes a first resistor terminal, a second resistor terminal, a stack of electrically resistive materials disposed in a trench of a substrate, electrical contacts at ends of the electrically resistive materials, and switch circuitry. The switch circuitry is electrically connected to the electrical contacts. The switch circuitry is configured to selectively electrically connect the electrically resistive materials between the first resistor terminal and the second resistor terminal in two or more configurations having two or more different total resistance values associated therewith responsive to control signals. The controller is configured to provide the control signals to the switch circuitry. The control signals are each associated with one of the two or more different total resistance values and a corresponding one of the two or more configurations.

In some embodiments a method of operating an electrical system includes providing a control signal to switch circuitry. The control signal indicates a desired resistance value of a variable resistor including a stack of electrically resistive materials disposed in a stepped trench of a substrate. The method also includes electrically connecting, by the switch circuitry, at least some of the electrically resistive materials of the stack between a first resistor terminal and a second resistor terminal in a configuration corresponding to the desired resistance value responsive to the control signal.

FIG. 1 is a longitudinal cross-section of a resistor device 100, according to some embodiments. The resistor device 100 includes a substrate 102 including a semiconductor material. The substrate 102 defines a trench 104 therein. The resistor device 100 also includes a first electrically resistive material 106, a second electrically resistive material 110, and a third electrically resistive material 114 within the trench 104. The resistor device 100 further includes a first electrically insulating material 108 between the first electrically resistive material 106 and the second electrically resistive material 110, a second electrically insulating material 112 between the second electrically resistive material 110 and the third electrically resistive material 114, and a third electrically insulating material 116 on the third electrically resistive material 114. By way of non-limiting example, the first electrically insulating material 108, the second electrically insulating material 112, and the third electrically insulating material 116 may include an oxide material (e.g., silicon dioxide ($SiO_2$)).

Stated another way, the resistor device 100 includes a stack of electrically resistive materials (the first electrically resistive material 106, the second electrically resistive material 110, and the third electrically resistive material 114) disposed (e.g., formed) in the trench 104 of the substrate 102. The first electrically resistive material 106 is between the second electrically resistive material 110 and the substrate 102. Also, the second electrically resistive material 110 is between the third electrically resistive material 114 and the first electrically resistive material 106. It should be noted that although the resistor device 100 of FIG. 1 includes three electrically resistive materials, it is contemplated within the scope of the disclosure that any number greater than one of electrically resistive materials may be used including two electrically resistive materials, four electrically resistive materials, and any number greater than four electrically resistive materials. The number of electrically resistive materials in the trench 104 determines the corresponding number of resistors of the resistor device 100. The resistor device 100 may, for example be a vertically oriented resistor.

In some embodiments, the first electrically resistive material 106, the second electrically resistive material 110, and the third electrically resistive material 114 may include a polycrystalline semiconductor material, such as a doped polycrystalline semiconductor material. By way of non-limiting example, the first electrically resistive material 106, the second electrically resistive material 110, and the third electrically resistive material 114 may include polycrystalline silicon, such as doped polycrystalline silicon. The first electrically resistive material 106, the second electrically resistive material 110, and the third electrically resistive material 114 may be similarly doped, such as including substantially the same dopant and substantially the same dopant concentration. Alternatively, one or more of the first electrically resistive material 106, the second electrically resistive material 110, and the third electrically resistive material 114 may include different dopants and/or different dopant concentrations.

The first electrically resistive material 106, the second electrically resistive material 110, and the third electrically resistive material 114 may serve as resistors in electrical circuits. As the first electrically resistive material 106, the second electrically resistive material 110, and the third electrically resistive material 114 are vertically offset from each other rather than horizontally offset from each other, less chip area may be occupied by the first electrically resistive material 106, the second electrically resistive material 110, and the third electrically resistive material 114 as compared to horizontally offset electrically resistive materials (e.g., serpentine resistors). As a result, more chip area may be available for other circuitry, or the total area of the chip may be reduced.

As discussed above, factors that influence the electrical resistance of an electrically resistive material include a cross-sectional area of the electrically resistive material, a length of the electrically resistive material, and a dopant concentration of the electrically resistive material. Accordingly, target electrical resistances of the first electrically resistive material 106, the second electrically resistive material 110, and the third electrically resistive material 114 may be tailored during manufacture of the resistor device 100 by considering cross-sectional areas, lengths, and dopant concentrations of the first electrically resistive material 106, the second electrically resistive material 110, and the third electrically resistive material 114.

In some embodiments electrical resistances of the first electrically resistive material 106, the second electrically resistive material 110, and the third electrically resistive material 114 may be substantially equal to each other. Although the first electrically resistive material 106, the second electrically resistive material 110, and the third electrically resistive material 114 illustrated in FIG. 1 have different lengths, their electrical resistances may be substantially equalized, if desired, by adjusting their cross-sectional areas (e.g., their widths, their thicknesses) and/or their dopant concentrations. In some embodiments the electrical resistances of the first electrically resistive material 106, the second electrically resistive material 110, and the third electrically resistive material 114 may be different from each other. By way of non-limiting example, the cross-sectional areas and dopant concentrations for the first electrically resistive material 106, the second electrically resistive material 110, and the third electrically resistive material 114 may be substantially equal, and the resistances of the first electrically resistive material 106, the second electrically resistive material 110, and the third electrically resistive material 114 may be different from each other based on differences in the lengths of the first electrically resistive material 106, the second electrically resistive material 110, and the third electrically resistive material 114.

In some embodiments dopant concentrations of the first electrically resistive material 106, the second electrically resistive material 110, and the third electrically resistive material 114 are substantially equal to each other. In other words, the dopant concentrations may be matched. In some embodiments the dopant concentrations of the first electrically resistive material 106, the second electrically resistive material 110, and the third electrically resistive material 114 are different from each other.

Assuming that dopant concentrations of the first electrically resistive material 106, the second electrically resistive material 110, and the third electrically resistive material 114 are on average substantially equal to a dopant concentration of a conventional serpentine resistor (not shown), area scaling of the resistor device 100 as compared to the conventional serpentine resistor may be substantially the depth of the trench 104 divided by a thickness of the conventional serpentine resistor. By way of non-limiting example, area scaling may be substantially 2.5 times, corresponding to a depth of the trench that is 2.5 times a thickness of a conventional serpentine resistor. In practice, dopant concentrations of polysilicon materials may be lower the deeper inside the trench 104 (e.g., the first electrically resistive material 106 at the bottom of the trench 104 may have a lower dopant concentration than the conventional serpentine resistor), which may further increase resistance and improve scaling of the resistor device 100 as compared to a conventional serpentine resistor.

In some embodiments cross-sectional areas of the first electrically resistive material 106, the second electrically resistive material 110, and the third electrically resistive material 114 are substantially equal to each other. In some embodiments the cross-sectional areas of the first electrically resistive material 106, the second electrically resistive material 110, and the third electrically resistive material 114 are different from each other.

In some embodiments different electrically resistive materials having different electrical resistances associated therewith may be used for the first electrically resistive material 106, the second electrically resistive material 110, and the third electrically resistive material 114.

The resistor device 100 also includes an etch stop material 118 within the trench 104 between the substrate 102 and the first electrically resistive material 106. By way of non-limiting example, the etch stop material 118 may include a nitride material such as silicon nitride (e.g., $Si_3N_4$). The etch stop material 118 may be used as a etch stop material for adding electrical contacts during manufacturing of the resistor device 100, as will be discussed in more detail with reference to FIG. 2A and FIG. 2R.

The resistor device 100 includes electrical contacts electrically connected (e.g., electrically coupled) to the first electrically resistive material 106, the second electrically resistive material 110, and the third electrically resistive material 114 at ends of the trench 104. The resistor device 100 includes a first electrical contact 120 electrically connected to the first electrically resistive material 106 at a first end 130 of the trench 104, a second electrical contact 122 electrically connected to the second electrically resistive material 110 at the first end 130 of the trench 104, and a third electrically resistive material 114 at the first end 130. The resistor device 100 also includes a fourth electrical contact 126 electrically connected to the first electrically resistive material 106, the second electrically resistive material 110, and the third electrically resistive material 114 at a second end 132 of the trench 104. Accordingly, the first electrically resistive material 106, the second electrically resistive material 110, and the third electrically resistive material 114 are electrically connected to each other at the second end 132 of the trench 104.

The substrate 102 is terraced (e.g., stepped) at the first end 130 of the trench 104 to accommodate separate electrical contacts electrically connected to the first electrically resistive material 106, the second electrically resistive material 110, or the third electrically resistive material 114. As a result, the substrate 102 includes steps similar to stairs at the first end 130. In the example of FIG. 1 the substrate 102 is terraced at both the first end 130 and the second end 132 of the trench 104 and therefore also includes steps similar to stairs at the second end 132. Of course, during manufacturing of semiconductor devices such as the resistor device 100, perfect and near-perfect corners, such as those at the terraced ends of the trench 104 illustrated in FIG. 1 may not be as sharp or as near-perfect as illustrated.

Conductive materials of the electrical contacts are separated from the electrically resistive materials by a contact insulator material 128, with only a portion of an electrical contact electrically connected to a respective electrically resistive material. Outside walls of the electrical contacts (e.g., the first electrical contact 120, the second electrical contact 122, the third electrical contact 124, and the fourth electrical contact 126) are lined with the contact insulator material 128 including an electrically insulating material. By way of non-limiting example, the contact insulator material 128 may include a silicon oxynitride material (e.g., $SiO_xN_y$, such as $SiO_2N_2$). The presence of the contact insulator material 128 electrically isolates the electrical contacts from any of the first electrically resistive material 106, the second electrically resistive material 110, and the third electrically resistive material 114 other than one of the first electrically resistive material 106, the second electrically resistive material 110, and the third electrically resistive material 114 that is at the bottom of the electrical contacts. More specifically, the first electrical contact 120 is electrically connected to the first electrically resistive material 106, but is electrically isolated from the second electrically resistive material 110 and the third electrically resistive material 114 by the contact insulator material 128. Also, the second electrical contact 122 is electrically connected to the second electrically resistive material 110 but is electrically isolated from the third electrically resistive material 114 by the contact insulator material 128.

Electrical traces (not shown) on the resistor device 100 may be used to electrically connect to the electrical contacts. By way of non-limiting example, a desired total resistance of the resistor device 100 may be achieved by hardwiring one or more of the electrically resistive materials 106, 110, 114 in a desired configuration. By way of non-limiting example, two or more of the electrically resistive materials 106, 110, 114 may be hardwired in parallel with each other to obtain a desired total resistance of the resistor device 100. Also by way of non-limiting example, two of the electrically resistive materials 106, 110, 114 may be hardwired in series with each other to obtain a desired total resistance of the resistor device 100. As a further non-limiting example, both series and parallel combinations of the electrically resistive materials 106, 110, 114 may be hardwired to obtain a desired total resistance of the resistor device 100.

Switch circuitry (not shown) may also be used to selectively electrically connect the electrical contacts between two terminals to implement a variable resistor, as will be discussed below with reference to FIG. 3.

Although the first electrically resistive material 106, the second electrically resistive material 110, and the third electrically resistive material 114 are illustrated in FIG. 1 as being vertically stacked (e.g., stacked in a vertical direction) within the trench 104, in some embodiments the first electrically resistive material 106, the second electrically resistive material 110, and the third electrically resistive material 114 may instead be horizontally stacked within the trench 104 with electrically insulating materials between.

Figure 2A:
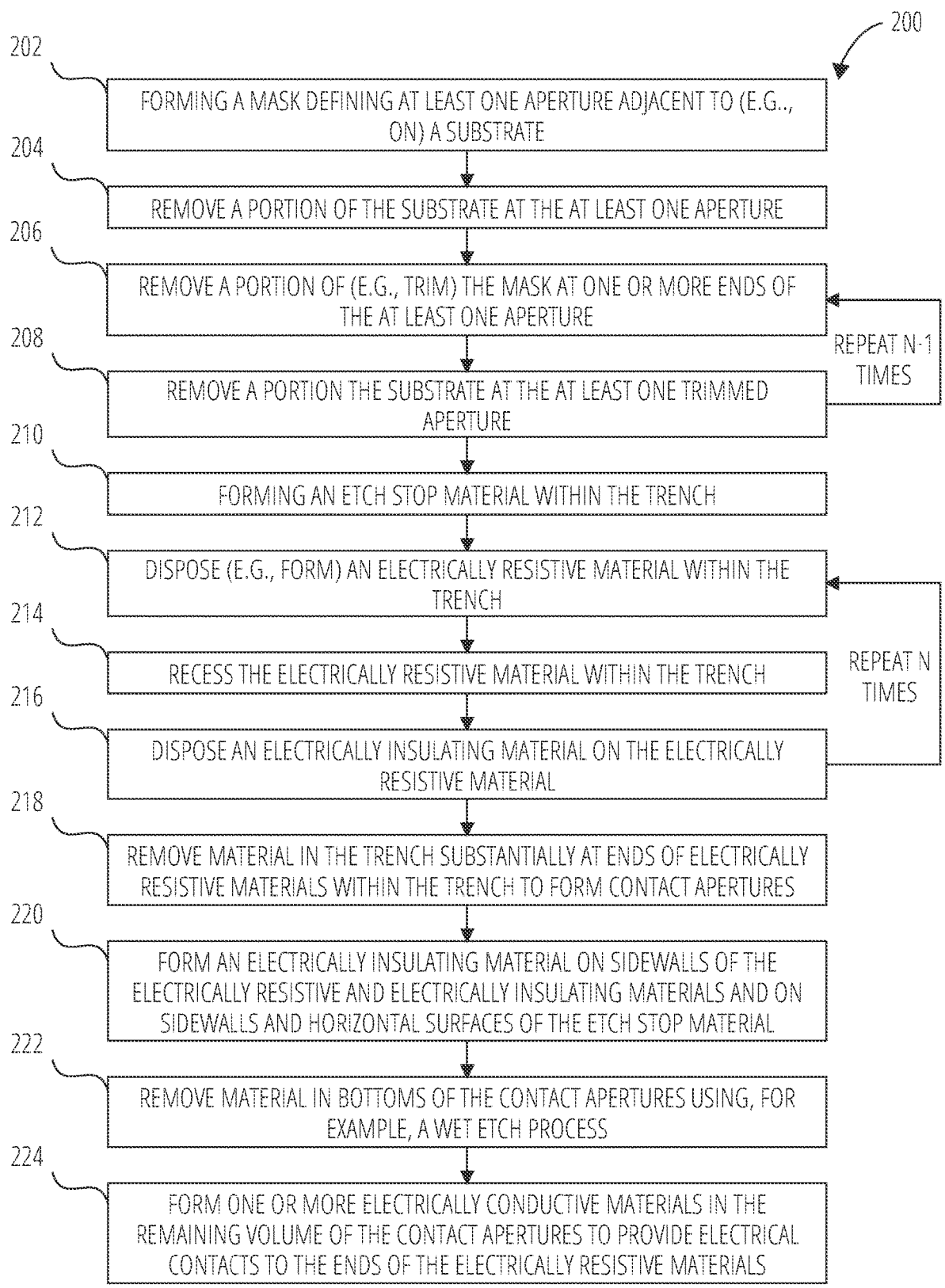
FIG. 2A is a flowchart illustrating a method of manufacturing the resistor device of FIG. 1, according to some embodiments.

FIG. 2A is a flowchart illustrating a method 200 of manufacturing the resistor device 100 of FIG. 1, according to some embodiments.

Figure 2B:
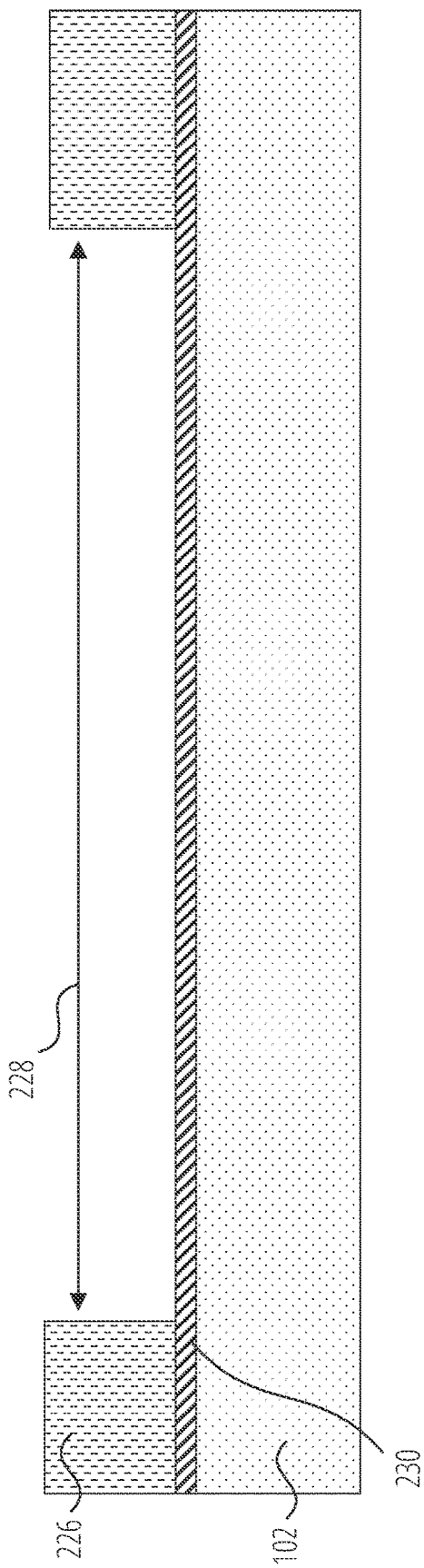
FIG. 2B through FIG. 2U illustrate operations of the method 200 of FIG. 2A.

FIG. 2B through FIG. 2U illustrate operations of the method 200 of FIG. 2A. Referring to FIG. 2A and FIG. 2B together, at operation 202 the method 200 includes forming a mask 226 (e.g., a hard mask) defining at least one aperture 228 adjacent to (e.g., on) a substrate 102. The substrate 102 includes an etch stop material 230 thereon, and the mask 226 is formed on the etch stop material 230.

In some embodiments the mask 226 may include a hard mask including silicon nitride on silicon dioxide, which has been patterned with the at least one aperture 228. In some embodiments the mask 226 may include a polysilicon material between a silicon nitride and a silicon dioxide. In some embodiments the mask 226 includes a relatively thick silicon dioxide material. Alternatively, the mask 226 may include a resist material. The mask 226 may serve to expose a portion of the substrate 102 that will subsequently be removed to form a trench 104 therein, and protect other portions of the substrate 102 from being removed.

Figure 2C:
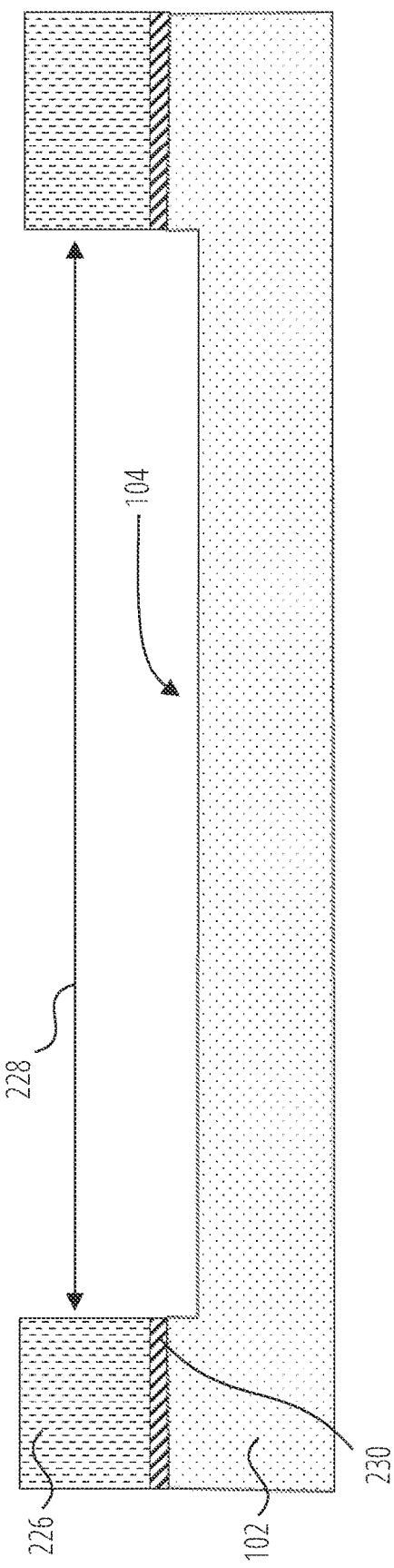

Referring to FIG. 2A and FIG. 2C together, at operation 204 the method 200 includes removing a portion of the substrate 102 at the at least one aperture 228. FIG. 2C shows a portion of the etch stop material 230 and an underlying portion of the substrate 102 at the aperture 228 removed. In some embodiments removing the substrate 102 includes etching (e.g., using a dry etch) the substrate 102. By way of non-limiting example, etching the substrate 102 may include using an anisotropic etch to remove the desired portion of the etch stop material 230 and the substrate 102. The trench 104 may be formed by a plasma etch process.

Figure 2D:
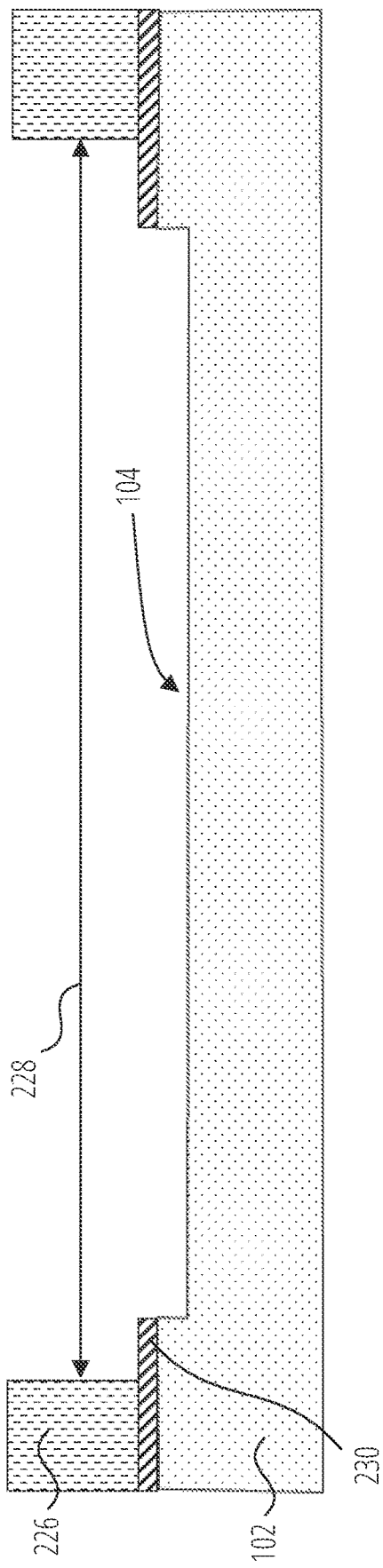

Referring to FIG. 2A and FIG. 2D together, at operation 206 the method 200 includes removing a portion of (e.g., trimming) the mask 226 at one or more ends of the at least one aperture 228. In some embodiments removing the portion of the mask 226 may include using an oxygen (O2) treatment (e.g., an oxygen plasma treatment) or a forming gas plasma treatment to remove the portion of the mask 226. In some embodiments removing a portion of the mask 226 may be followed by a plasma treatment (e.g., to reduce a line edge roughness). FIG. 2D illustrates the mask 226 trimmed at both ends as compared to FIG. 2C (i.e., the aperture 228 is longer in FIG. 2D than in FIG. 2C).

Figure 2E:
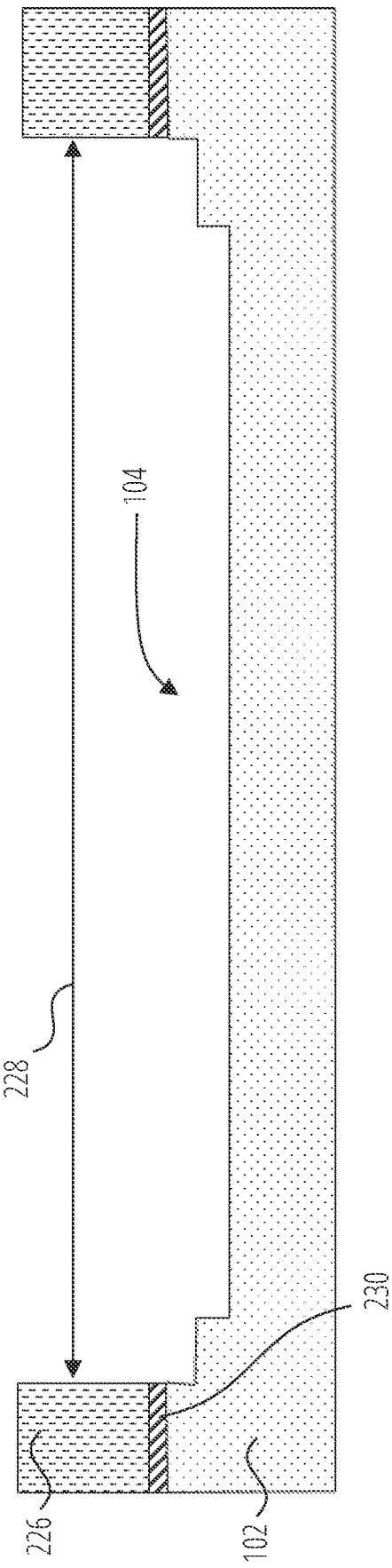

Referring to FIG. 2A and FIG. 2E together, at operation 208 the method 200 includes removing a portion of the substrate 102 at the at least one trimmed aperture 228. FIG. 2E shows another portion of the etch stop material 230 and another portion of the substrate 102 at the aperture 228 removed, forming steps defined by sidewalls and horizontal surfaces of the substrate 102. Operation 208 (removing a portion of the substrate 102 at the at least one trimmed aperture 228) may be performed similarly as discussed above with reference to operation 204 (removing a portion of the substrate 102 at the at least one aperture 228).

Operation 206 (removing a portion of the mask 226 at one or more ends of the at least one aperture) and operation 208 (removing a portion of the substrate 102 at the at least one trimmed aperture 228) may be repeated N−1 times, where N is a predetermined number greater than or equal to one. The predetermined number N may be selected to be one less than a total number of electrically resistive materials (e.g., the first electrically resistive material 106, the second electrically resistive material 110, and the third electrically resistive material 114 of FIG. 1) to be formed in the trench 104. In the example illustrated in FIG. 1 and FIG. 2B-FIG. 2U the predetermined number N is two (one less than three electrically resistive materials). Accordingly, operation 206 and operation 208 may be repeated N−1 times, or in this case, one time (2−1=1 for N=2).

Referring to FIG. 2A and FIG. 2F together, at repeated operation 206 the method 200 includes removing a portion of the mask 226 at one or more ends of the at least one aperture 228. FIG. 2F illustrates the mask 226 trimmed at both ends as compared to FIG. 2E (i.e., the aperture 228 is longer in FIG. 2F than in FIG. 2E).

Referring to FIG. 2A and FIG. 2G together, at repeated operation 208 the method 200 includes removing a portion of the substrate 102 at the at least one aperture 228. FIG. 2G shows another portion of the etch stop material 230 and another portion of the substrate 102 at the aperture 228 removed, forming the stepped trench 104'.

Referring to FIG. 2A and FIG. 2H together, at operation 210 the method 200 includes forming the etch stop material 118 within the trench 104', such as on the exposed sidewalls and the horizontal surfaces of the substrate 102. FIG. 2H illustrates the etch stop material 118 conformally formed on a bottom of the trench 104'. In some embodiments forming the etch stop material 118 within the trench 104' may include depositing the etch stop material 118 using chemical vapor deposition (CVD), physical vapor deposition (PVD), or spinning on techniques known in the art.

Figure 2I:
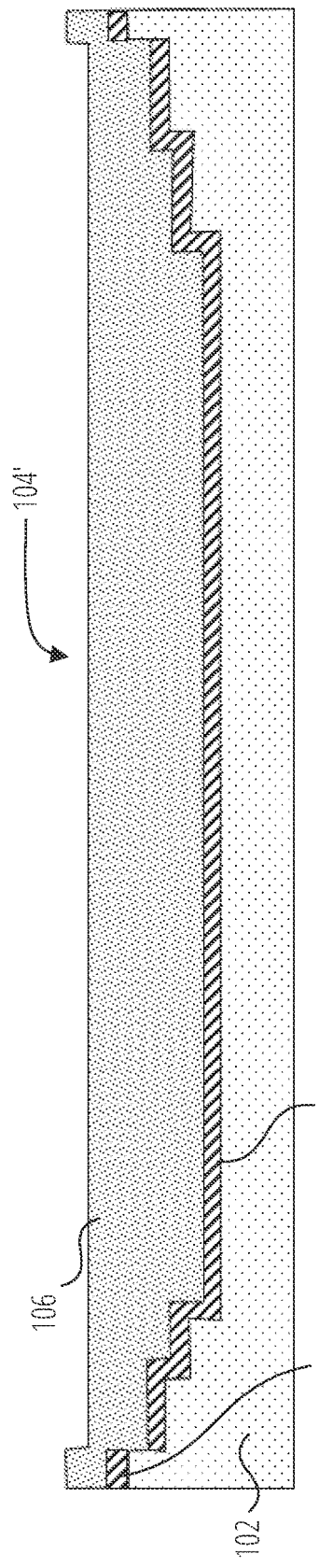

Referring to FIG. 2A and FIG. 2I together, at operation 212 the method 200 includes disposing (e.g., forming) an electrically resistive material within the trench 104'. FIG. 2I illustrates a first electrically resistive material 106 disposed in the trench 104'. In some embodiments disposing the electrically resistive material within the trench 104' may include growing or depositing the electrically resistive material in the trench 104'. By way of non-limiting example, the electrically resistive material may be deposited using chemical vapor deposition (CVD) (e.g., low pressure CVD (LPCVD)) techniques known in the art. Doping of the first electrically resistive material 106 may be conducted as the material is formed in the trench 104' or after the material is formed in the trench 104. By way of non-limiting example, an implantation process may be used to dope the electrically resistive material after operation 214, recessing the electrically resistive material, or after operation 216, disposing an electrically insulating material on the electrically resistive material.

Some electrically resistive materials such as polysilicon may grow faster within the trench 104' than elsewhere on the substrate 102. As a result, FIG. 2I illustrates the first electrically resistive material 106 as being formed to a greater thickness in the trench 104' than outside of the trench 104'.

Figure 2J:
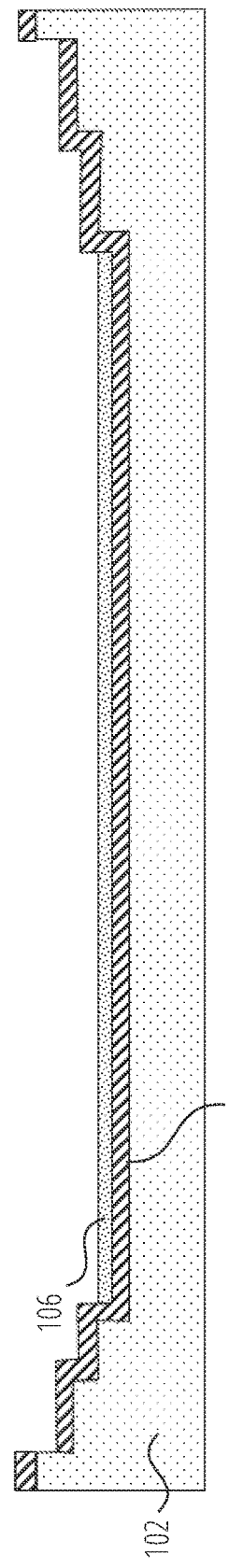

Referring to FIG. 2A and FIG. 2J together, at operation 214 the method 200 includes recessing the electrically resistive material within the trench 104'. FIG. 2J illustrates the first electrically resistive material 106 recessed to below a first terraced level of the trench 104 above a bottom surface of the trench 104'. By way of non-limiting example, recessing the electrically resistive material may include planarizing the electrically resistive material (e.g., using a chemical mechanical polishing (CMP) process). Also by way of non-limiting example, recessing the electrically resistive material may include using etching processes known in the art or using a combination of a CMP process and etching process. In some embodiments a top surface of the electrically resistive material following recessing of the electrically resistive material may be substantially planar, as shown for the first electrically resistive material 106 of FIG. 2J. In some embodiments, however, the top surface may include a protrusion (e.g., a stub) extending upwards from a lower level to form a higher level. In some embodiments the protrusion may extend above a level of the etch stop material 118 above the level on which the electrically resistive material is disposed.

Figure 2K:
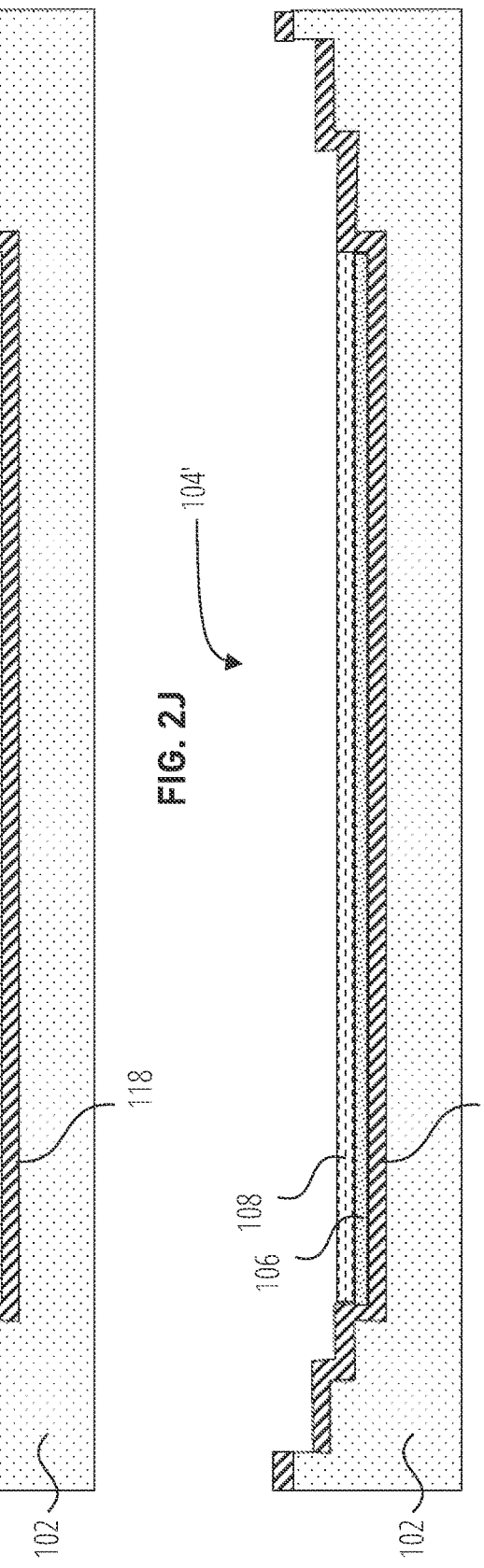

Referring to FIG. 2A and FIG. 2K together, at operation 216 the method 200 includes disposing an electrically insulating material on the electrically resistive material. In some embodiments disposing the electrically insulating material may include depositing the electrically insulating material (e.g., a surface oxide) using CVD, PVD, spinning on, or other processes known in the art. In some embodiments disposing the electrically insulating material may include growing the electrically insulating material. For example, where the electrically resistive material is polysilicon, a silicon dioxide material may be grown on the polysilicon to dispose the electrically insulating material on the electrically resistive material. By growing the electrically insulating material on the electrically resistive material, a thickness of the material may be controlled. The thickness of the electrically resistive material may be sufficient to isolate the electrically resistive materials. FIG. 2K illustrates a first electrically insulating material 108 disposed on the first electrically resistive material 106. In some embodiments a top surface of the first electrically insulating material 108 may be substantially coplanar (e.g., level) with the first terraced level of the trench 104' above the bottom surface of the trench 104'. As discussed with reference to operation 214, in some embodiments the electrically resistive material on which the electrically insulating material is disposed may include a protrusion extending upward. In such embodiments the electrically insulating material may have a cross-section resembling an upside-down "U" to conform to the top surface of the protrusion.

Operation 212 (disposing an electrically resistive material within the trench 104'), operation 214 (recessing the electrically resistive material within the trench 104'), and operation 216 (disposing an electrically insulating material on the electrically resistive material) may be repeated the predetermined number N of times. As previously discussed, the predetermined number N may be selected to be one less than a total number of electrically resistive materials (e.g., the first electrically resistive material 106, the second electrically resistive material 110, and the third electrically resistive material 114 of FIG. 1) to be formed in the trench 104'. In the example illustrated in FIG. 1 and FIG. 2B-FIG. 2U the predetermined number N is two (one less than three electrically resistive materials). Accordingly, operation 212, operation 214, and operation 216 may be repeated N times, or in this case, two times.

Figure 2L:
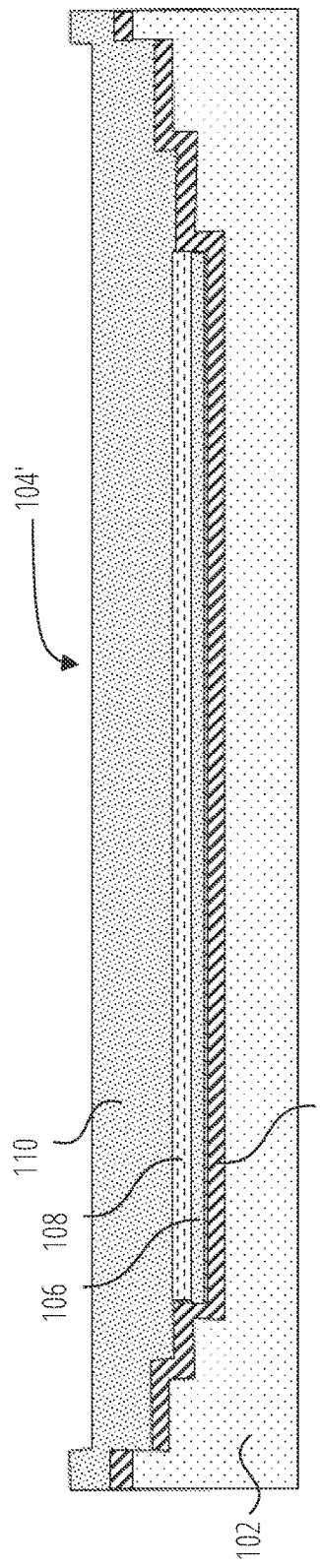

Referring to FIG. 2A and FIG. 2L together, at first repeated operation 212 the method 200 includes disposing an electrically resistive material within the trench 104'. As illustrated in FIG. 2L, the second electrically resistive material 110 is disposed in the trench 104'.

Figure 2M:
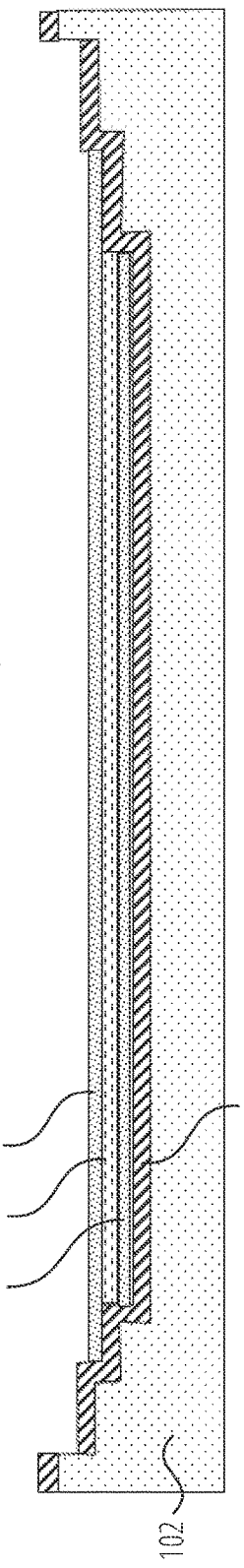

Referring to FIG. 2A and FIG. 2M together, at first repeated operation 214 the method 200 includes recessing the electrically resistive material within the trench 104'. FIG. 2M illustrates the second electrically resistive material 110 recessed to below a second terraced level of the trench 104' above the first terraced level.

Figure 2N:
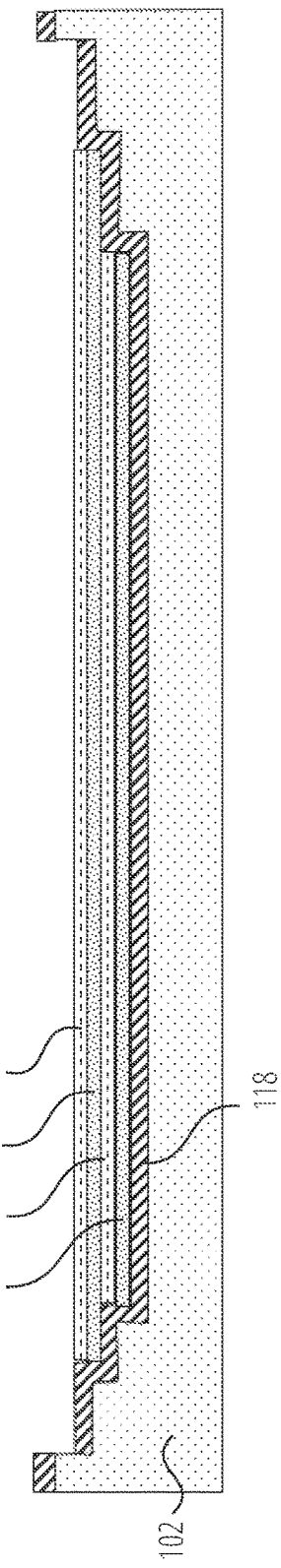

Referring to FIG. 2A and FIG. 2N together, at first repeated operation 216 the method 200 includes disposing an electrically insulating material on the electrically resistive material. FIG. 2N illustrates a second electrically insulating material 112 disposed on the second electrically resistive material 110. The second electrically insulating material 112 may be substantially level with the second terraced level of the trench 104' above the first terraced level.

Figure 2O:
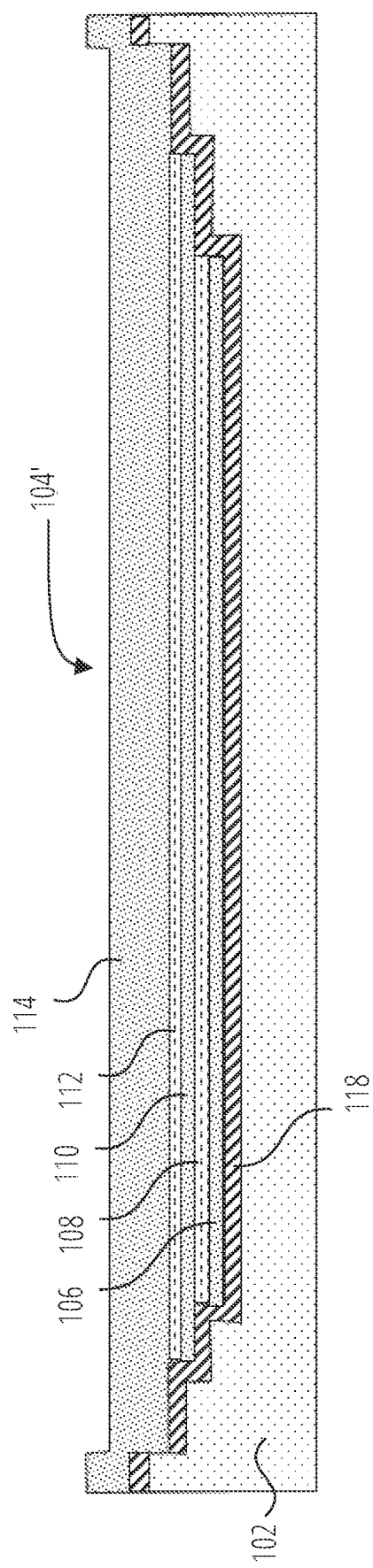

Referring to FIG. 2A and FIG. 2O together, at second repeated operation 212 the method 200 includes disposing an electrically resistive material within the trench 104'. As illustrated in FIG. 2O, the third electrically resistive material 114 is disposed in the trench 104'.

Figure 2P:
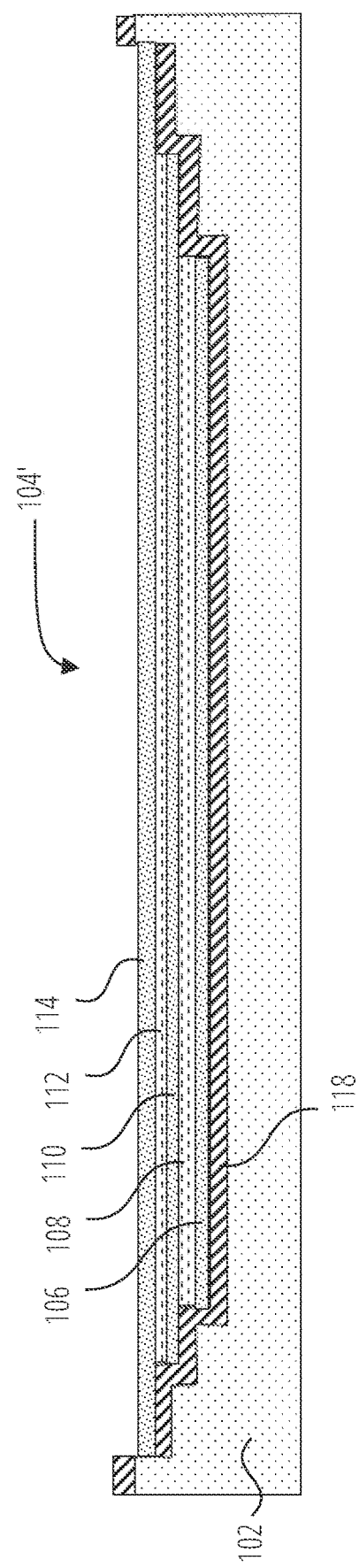

Referring to FIG. 2A and FIG. 2P together, at second repeated operation 214 the method 200 includes recessing the electrically resistive material within the trench 104'. FIG. 2P illustrates the third electrically resistive material 114 recessed to below a third terraced level of the trench 104' above the second terraced level.

Figure 2Q:
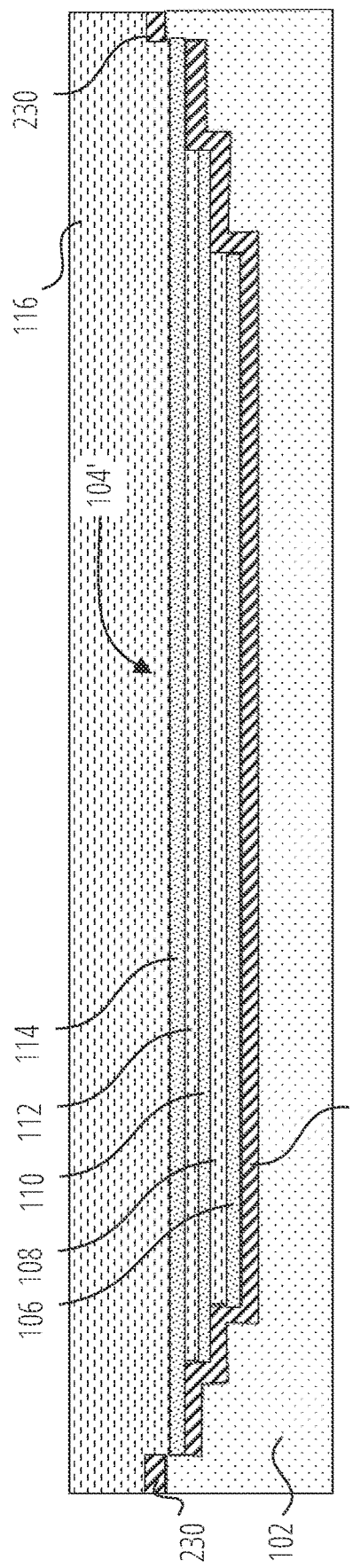

Referring to FIG. 2A and FIG. 2Q together, at second repeated operation 216 the method 200 includes disposing an electrically insulating material on the electrically resistive material. FIG. 2Q illustrates a third electrically insulating material 116 disposed on the third electrically resistive material 114. The third electrically insulating material 116 may also extend over the etch stop material 230 at the ends of the substrate 102.

Figure 2R:
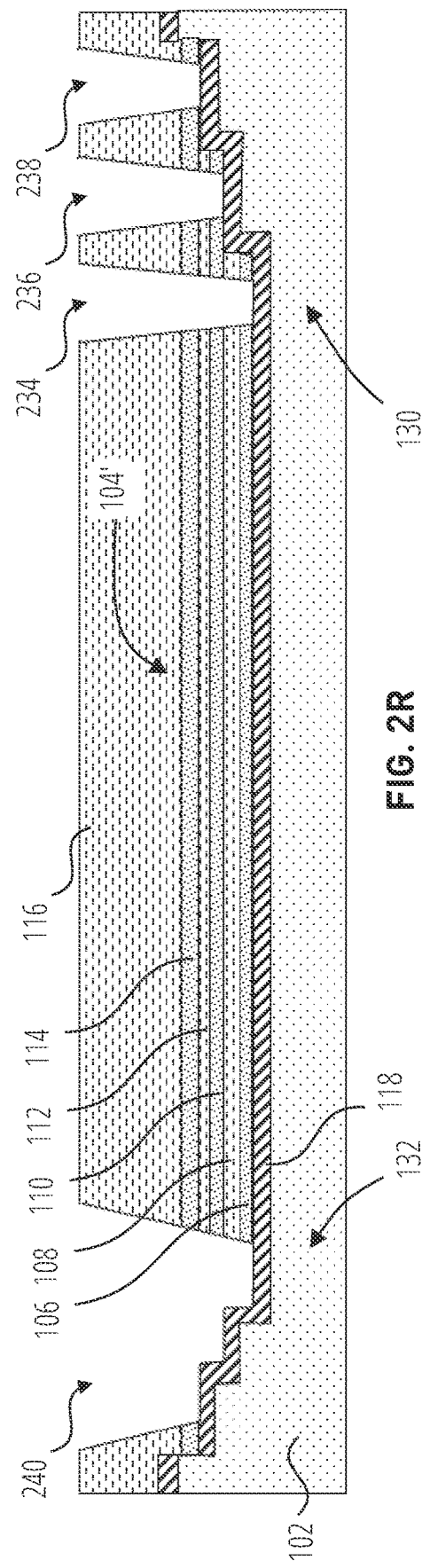

Referring to FIG. 2A and FIG. 2R together, at operation 218 the method 200 includes removing material in the trench 104' substantially at ends of electrically resistive materials (e.g., the first electrically resistive material 106, the second electrically resistive material 110, the third electrically resistive material 114) within the trench 104' to form contact apertures. In some embodiments, removing material to form contact apertures includes using a removal process that selectively removes the electrically resistive material (e.g., polysilicon) and the electrically insulating material (e.g., oxide such as silicon dioxide) but does not substantially remove the etch stop material 118. FIG. 2R illustrates forming a first contact aperture 234, a second contact aperture 236, and a third contact aperture 238 at substantially a first end 130 of the trench 104'. FIG. 2R also illustrates forming a fourth contact aperture 240 at a second end 132 of the trench 104'. The contact apertures 234, 236, 238, 240 may be formed by conducting one or more photolithography and removal processes, such as photolithography and etch processes.

Referring to FIG. 2A and FIG. 2S together, at operation 220 the method 200 includes forming an electrically insulating material on sidewalls of the third electrically insulating material 116, the third electrically resistive material 114, the second electrically insulating material 112, the second electrically resistive material 110, the first electrically insulating material 108, and the first electrically resistive material 106, and on sidewalls and horizontal surfaces of etch stop material 230. The electrically insulating material may be conformally formed in the contact apertures 234, 236, 238, 240. In some embodiments forming the electrically insulating material includes using deposition and etch processes such that the electrically insulating material may remain on the sidewalls of the third electrically insulating material 116, the third electrically resistive material 114, the second electrically insulating material 112, the second electrically resistive material 110, the first electrically insulating material 108, and the first electrically resistive material 106, and on the sidewalls of the etch stop material 230. FIG. 2S illustrates contact insulator material 128 (e.g., SiON) on the sidewalls of the first contact aperture 234, the second contact aperture 236, the third contact aperture 238, and the fourth contact aperture 240. The contact insulator material 128 may be formed in situ or ex situ.

Referring to FIG. 2A and FIG. 2T together, at operation 222 the method 200 includes removing material in bottoms of the contact apertures (e.g., the first contact aperture 234, the second contact aperture 236, the third contact aperture 238, and the fourth contact aperture 240) using, for example, a wet etch process. A wet etch process is used to remove a portion of the etch stop material 118 both vertically and horizontally (e.g., an isotropic etch). FIG. 2T illustrates the etch stop material 230 at the bottoms of the first contact aperture 234, the second contact aperture 236, the third contact aperture 238, and the fourth contact aperture 240 removed. Since a wet process is used, part of the contact insulator material 128 at the bottoms of contact apertures is removed, exposing portions of the electrically resistive materials (the first electrically resistive material 106, the second electrically resistive material 110, the third electrically resistive material 114) at the bottoms of the contact apertures.

Referring to FIG. 2A and FIG. 2U together, at operation 224 the method 200 includes forming one or more electrically conductive materials in the remaining volume of the contact apertures to provide electrical contacts to the ends of the electrically resistive materials. The electrically conductive material may substantially fill the contact apertures (e.g., the first contact aperture 234, the second contact aperture 236, the third contact aperture 238, and the fourth contact aperture 240). By way of non-limiting example, forming the one or more electrically conductive materials may include forming a liner material (e.g., titanium nitride (TiN)) (e.g., using a PVD or CVD process) and forming a contact metal (e.g., aluminum, tungsten, titanium, etc.) in the contact apertures. FIG. 2U illustrates the first contact aperture 234, the second contact aperture 236, the third contact aperture 238, and the fourth contact aperture 240 filled with an electrically conductive material to provide electrical contacts (e.g., the first electrical contact 120, the second electrical contact 122, the third electrical contact 124, and the fourth electrical contact 126) to the ends of the electrically resistive materials (e.g., the first electrically resistive material 106, the second electrically resistive material 110, and the third electrically resistive material 114). For simplicity and convenience, the liner material and the contact metal are not differentiated in FIG. 2U. The electrical contacts, however, may include both the liner material and the contact metal, with the liner material ensuring that each resistor (e.g., each electrically resistive material) is electrically connected to one contact. By previously removing a portion of the contact insulator material 128 from the bottoms of the contact apertures, the electrically conductive materials of the first electrical contact 120, the second electrical contact 122, and the third electrical contact 124 are electrically connected to the first electrically resistive material 106, the second electrically resistive material 110, the third electrically resistive material 114, respectively. Therefore, each of the first electrical contact 120, the second electrical contact 122, and the third electrical contact 124 is electrically connected to a single electrically resistive material.

Figure 3:
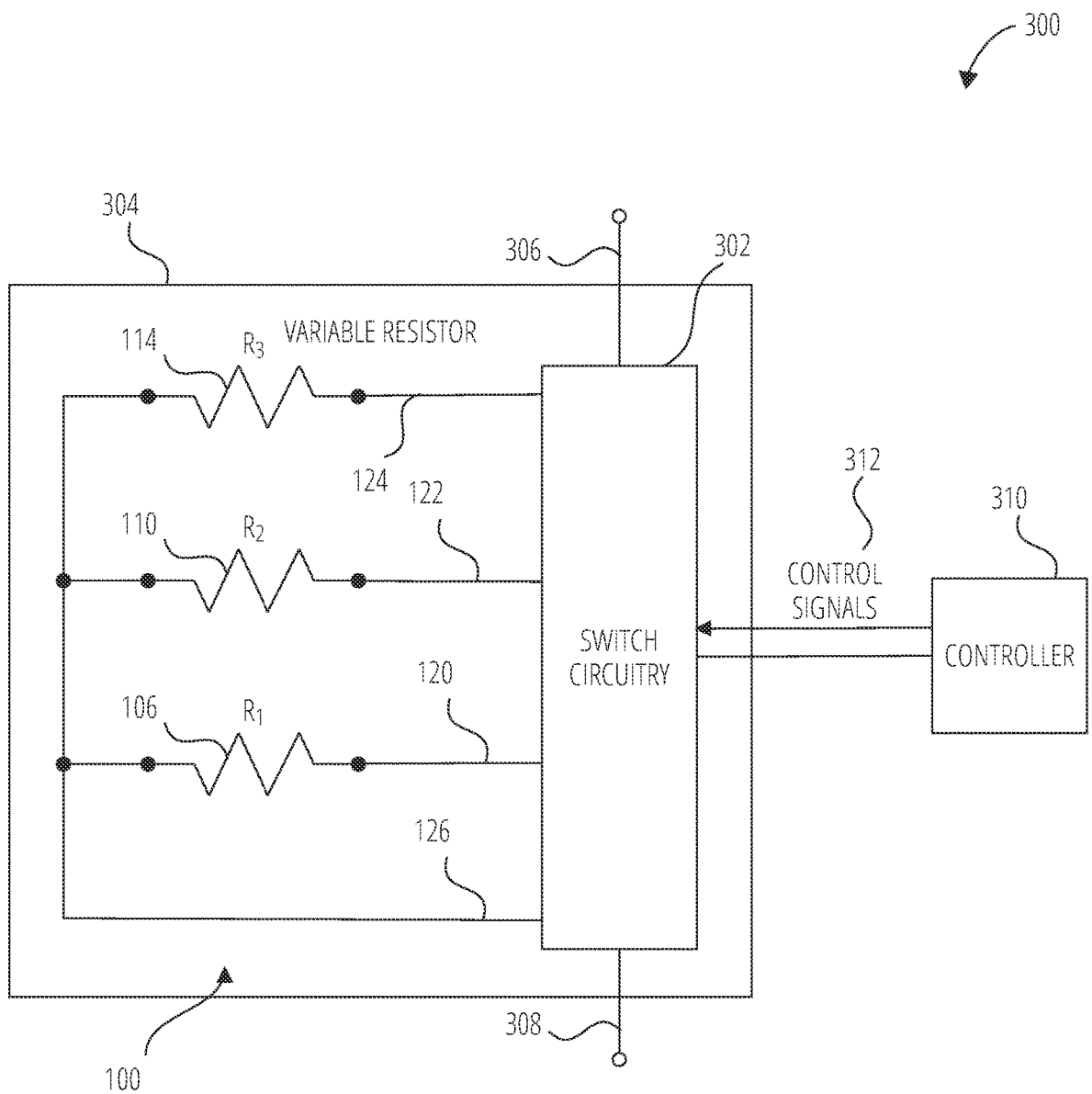
FIG. 3 is a block diagram of an electrical system including the resistor device of FIG. 1, according to some embodiments.

FIG. 3 is a block diagram of an electrical system 300 including the resistor device 100 of FIG. 1, according to some embodiments. As discussed above with reference to FIG. 1 the resistor device 100 includes a stack of electrically resistive materials disposed in a trench of a substrate. Specifically, the resistor device 100 includes a first electrically resistive material 106, a second electrically resistive material 110, and a third electrically resistive material 114 (illustrated as circuit schematic resistors in FIG. 3), and first electrical contact 120, second electrical contact 122, third electrical contact 124, and fourth electrical contact 126 at ends of the electrically resistive materials to enable electrical connection to the electrically resistive materials.

The electrical system 300 also includes a variable resistor 304 including a first resistor terminal 306, a second resistor terminal 308, the resistor device 100, and switch circuitry 302 electrically connected to the electrical contacts (e.g., the first electrical contact 120, the second electrical contact 122, the third electrical contact 124, and the fourth electrical contact 126). The switch circuitry 302 is configured to selectively electrically connect the electrically resistive materials between the first resistor terminal 306 and the second resistor terminal 308 in two or more configurations having two or more different total resistance values associated therewith responsive to control signals 312. Accordingly, the switch circuitry 302 is configured to implement the variable resistor 304 responsive to the control signals 312. The electrical system 300 further includes a controller 310 configured to provide the control signals 312 to the switch circuitry 302. The control signals 312 are each associated with one of the two or more different total resistance values and a corresponding one of the two or more configurations.

In some embodiments at least one of the two or more configurations corresponds to a parallel combination of two or more of the electrically resistive materials (e.g., the first electrically resistive material 106, the second electrically resistive material 110, and the third electrically resistive material 114). By way of non-limiting example, responsive to one of the control signals 312, the switch circuitry 302 may be configured to electrically connect the first electrically resistive material 106, which may have a first electrical resistance $R_1$ associated therewith, and the second electrically resistive material 110, which may have a second electrical resistance $R_2$ associated therewith, in parallel between the first resistor terminal 306 and the second resistor terminal 308, resulting in a total resistance of the variable resistor 304 of $$R_1 \| R_2 = \frac{R_1 R_2}{R_1 + R_2}.$$

Also by way of non-limiting example, responsive to another one of the control signals 312 the switch circuitry 302 may be configured to electrically connect the second electrically resistive material 110 and the third electrically resistive material 114, which may have a third electrical resistance $R_3$ associated therewith, in parallel between the first resistor terminal 306 and the second resistor terminal 308, resulting in a total resistance of the variable resistor 304 of $$R_2 \| R_3 = \frac{R_2 R_3}{R_2 + R_3}.$$

As a further non-limiting example, responsive to yet another one of the control signals 312, the switch circuitry 302 may be configured to electrically connect the first electrically resistive material 106 and the third electrically resistive material 114 in parallel between the first resistor terminal 306 and the second resistor terminal 308, resulting in a total resistance of the variable resistor 304 of $$R_1 \| R_3 = \frac{R_1 R_3}{R_1 + R_3}.$$

In yet a further non-limiting example, responsive to yet another one of the control signals 312, the switch circuitry 302 may be configured to electrically connect the first electrically resistive material 106, the second electrically resistive material 110, and the third electrically resistive material 114 in parallel between the first resistor terminal 306 and the second resistor terminal 308, resulting in a total resistance of the variable resistor 304 of $$R_1 \| R_2 \| R_3 = \frac{R_1 R_2 R_3}{R_1 R_2 + R_2 R_3 + R_1 R_3}.$$

In some embodiments at least one of the two or more configurations corresponds to a series combination of two or more of the electrically resistive materials between the first resistor terminal 306 and the second resistor terminal 308. By way of non-limiting example, responsive to one of the control signals 312, the switch circuitry 302 may be configured to electrically connect the first electrically resistive material 106 and the second electrically resistive material 110 in series between the first resistor terminal 306 and the second resistor terminal 308, resulting in a total resistance of the variable resistor 304 of $R_1+R_2$. Also by way of non-limiting example, responsive to another one of the control signals 312, the switch circuitry 302 may be configured to electrically connect the second electrically resistive material 110 and the third electrically resistive material 114 in series between the first resistor terminal 306 and the second resistor terminal 308, resulting in a total resistance of the variable resistor 304 of $R_2+R_3$. As a further non-limiting example, responsive to yet another one of the control signals 312, the switch circuitry 302 may be configured to electrically connect the first electrically resistive material 106 and the third electrically resistive material 114 in series between the first resistor terminal 306 and the second resistor terminal 308, resulting in a total resistance of the variable resistor 304 of $R_1+R_3$.

In some embodiments the at least one of the two or more configurations corresponds to a parallel combination and a series combination of the electrically resistive materials between the first resistor terminal 306 and the second resistor terminal 308. By way of non-limiting example, responsive to one of the control signals 312, the switch circuitry 302 may be configured to electrically connect the first electrically resistive material 106 in series with a parallel combination of the second electrically resistive material 110 and the third electrically resistive material 114 between the first resistor terminal 306 and the second resistor terminal 308, resulting in a total resistance of the variable resistor 304 of $$R_1 + \frac{R_2 R_3}{R_2 + R_3}.$$

Also by way of non-limiting example, responsive to another one of the control signals 312, the switch circuitry 302 may be configured to electrically connect the second electrically resistive material 110 in series with a parallel combination of the first electrically resistive material 106 and the third electrically resistive material 114 between the first resistor terminal 306 and the second resistor terminal 308, resulting in a total resistance of the variable resistor 304 of $$R_2 + \frac{R_1 R_3}{R_1 + R_3}.$$

As a further non-limiting example, responsive to yet another one of the control signals 312, the switch circuitry 302 may be configured to electrically connect the third electrically resistive material 114 in series with a parallel combination of the first electrically resistive material 106 and the second electrically resistive material 110 between the first resistor terminal 306 and the second resistor terminal 308, resulting in a total resistance of the variable resistor 304 of $$R_3 + \frac{R_1 R_2}{R_1 + R_2}.$$

In some embodiments the at least one of the two or more configurations corresponds to a single one of the electrically resistive materials between the first resistor terminal 306 and the second resistor terminal 308. By way of non-limiting example, responsive to one of the control signals 312, the switch circuitry 302 may be configured to electrically connect the first electrically resistive material 106 between the first resistor terminal 306 and the second resistor terminal 308, resulting in a total resistance of the variable resistor 304 of $R_1$. Also by way of non-limiting example, responsive to one of the control signals 312, the switch circuitry 302 may be configured to electrically connect the second electrically resistive material 110 between the first resistor terminal 306 and the second resistor terminal 308, resulting in a total electrical resistance of the variable resistor 304 of $R_2$. As a further non-limiting example, responsive to yet another one of the control signals 312, the switch circuitry 302 may be configured to electrically connect the third electrically resistive material 114 between the first resistor terminal 306 and the second resistor terminal 308, resulting in a total resistance of the variable resistor 304 of $R_3$.

As discussed above, the variable resistor 304 may have a total resistance of a variety of different values responsive to different control signals 312. Accordingly, the electrical system 300 of FIG. 3 illustrates that the resistor device 100 of FIG. 1 may be used to implement the variable resistor 304. Other implementations of the resistor device 100 of FIG. 1 and other similar resistor devices are contemplated herein as will be discussed in more detail with reference to FIG. 4, FIG. 5, FIG. 6, and FIG. 7.

Figure 4:
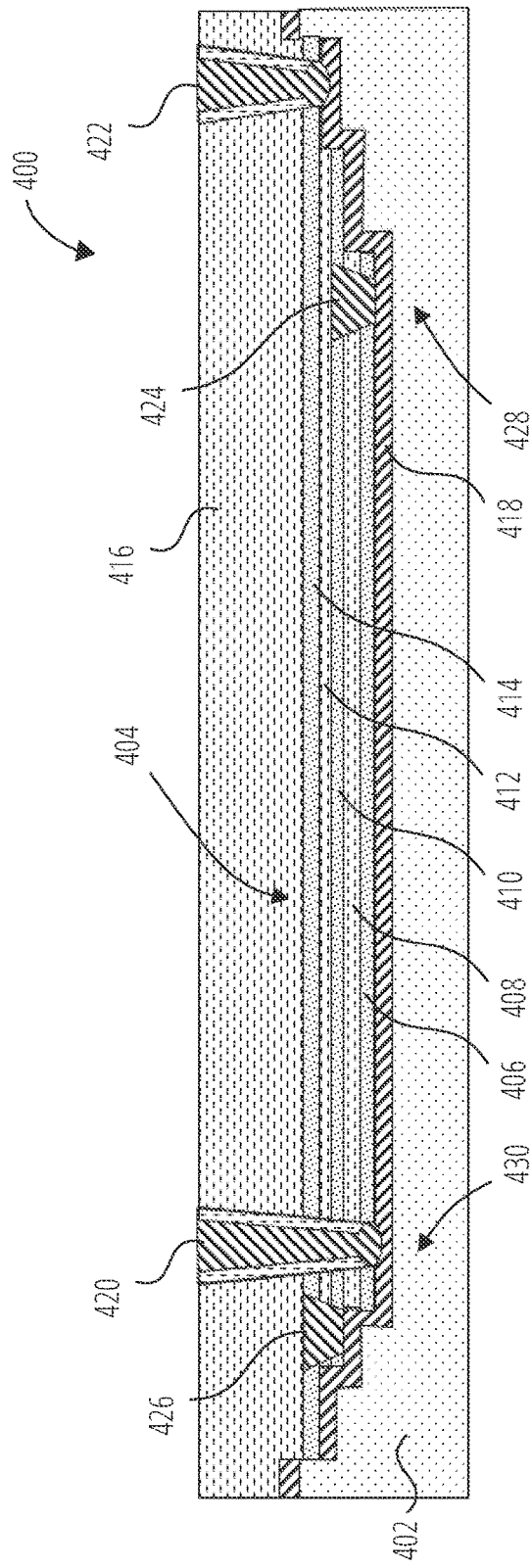
FIG. 4 is a longitudinal cross-sectional view of a resistor device that is hardwired as a vertical serpentine resistor, according to some embodiments.

FIG. 4 is a longitudinal cross-sectional view of a resistor device 400 that is hardwired as a vertical serpentine resistor, according to some embodiments. The resistor device 400 is similar to the resistor device 100 of FIG. 1. For example, the resistor device 400 includes a substrate 402, a trench 404, a first electrically resistive material 406, a first electrically insulating material 408, a second electrically resistive material 410, a second electrically insulating material 412, a third electrically resistive material 414, a third electrically insulating material 416, and a etch stop material 418 similar to the substrate 102, the trench 104, the first electrically resistive material 106, the first electrically insulating material 108, the second electrically resistive material 110, the second electrically insulating material 112, the third electrically resistive material 114, the third electrically insulating material 116, and the etch stop material 118 of the resistor device 100 of FIG. 1. The resistor device 400, however, includes a first conductive via 424 electrically connecting the first electrically resistive material 406 to the second electrically resistive material 410 at a first end 428 of the trench 404 and a second conductive via 426 electrically connecting the second electrically resistive material 410 to the third electrically resistive material 414 at a second end 430 of the trench 404.

The resistor device 400 further includes a first electrical contact 420 electrically connected to the first electrically resistive material 406 at the second end 430 of the trench 404 and a second electrical contact 422 electrically connected to the third electrically resistive material 414 at the first end 428 of the trench 404. The first electrical contact 420 and the second electrical contact 422 may be similar to the first electrical contact 120, the second electrical contact 122, and the third electrical contact 124 of FIG. 1. The resistor device 400 may be formed substantially as described above for the resistor device 100, except that contact apertures for the first conductive via 424, the second conductive via 426, the first electrical contact 420, and the second electrical contact 422 may be formed instead of the contact apertures 234, 236, 238, 240. The conductive material, such as the liner material and the contact metal, may be formed in the contact apertures for the first conductive via 424, the second conductive via 426, the first electrical contact 420, and the second electrical contact 422 as described above for the resistor device 100.

As discussed above for the resistor device 100 of FIG. 1, although the first electrically resistive material 406, the second electrically resistive material 410, and the third electrically resistive material 414 are illustrated as vertically stacked within the trench 404, in some embodiments the first electrically resistive material 406, the second electrically resistive material 410, and the third electrically resistive material 414 may instead be horizontally stacked within the trench 404.

Similar to the resistor device 100 of FIG. 1, conductive traces (not shown) may be used to hardwire the resistor device 400 to electrical circuitry. Also, switch circuitry may be used to selectively electrically connect the resistor device to electrical circuitry.

It is noted that electrical connection between the first electrically resistive material 406 and the second electrically resistive material 410 at the first end 428 may alternatively be achieved using an electrical contact similar to the fourth electrical contact 126 of FIG. 1 that electrically connects to both the first electrically resistive material 406 and the second electrically resistive material 410. Likewise, the second electrically resistive material 410 may be electrically connected to the third electrically resistive material 414 at the second end 430 using an electrical contact similar to the fourth electrical contact 126 that electrically connects to both the second electrically resistive material 410 and the third electrically resistive material 414.

Figure 5:
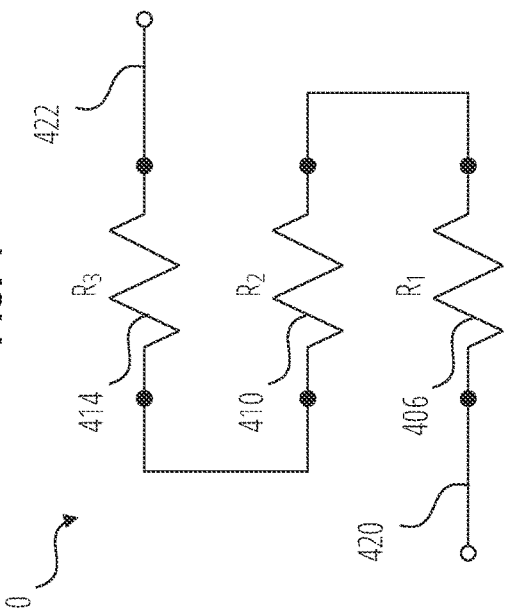
FIG. 5 is an electrical circuit schematic illustration of the resistor device of FIG. 4.

FIG. 5 is an electrical circuit schematic illustration of the resistor device 400 of FIG. 4. As illustrated in FIG. 4 and FIG. 5, the first electrically resistive material 406, which has a first electrical resistance $R_1$ associated therewith, the second electrically resistive material 410, which has a second electrical resistance $R_2$ associated therewith, and the third electrically resistive material 414, which has a third electrical resistance $R_3$ associated therewith, are electrically connected in series. Accordingly, a total electrical resistance of the resistor device 400 between the first electrical contact 420 and the second electrical contact 422 is $R_1+R_2+R_3$.

The hardwired, vertical serpentine structure of the resistor device 400 of FIG. 4 and FIG. 5 enables a relatively high resistance value of the resistor device 400 to be achieved that may otherwise only be achievable using a conventional, horizontally meandering serpentine resistor. As a result, the resistor device 400 may occupy less chip area than a conventional, horizontally meandering serpentine resistor without sacrificing a relatively high resistance value.

Figure 6:
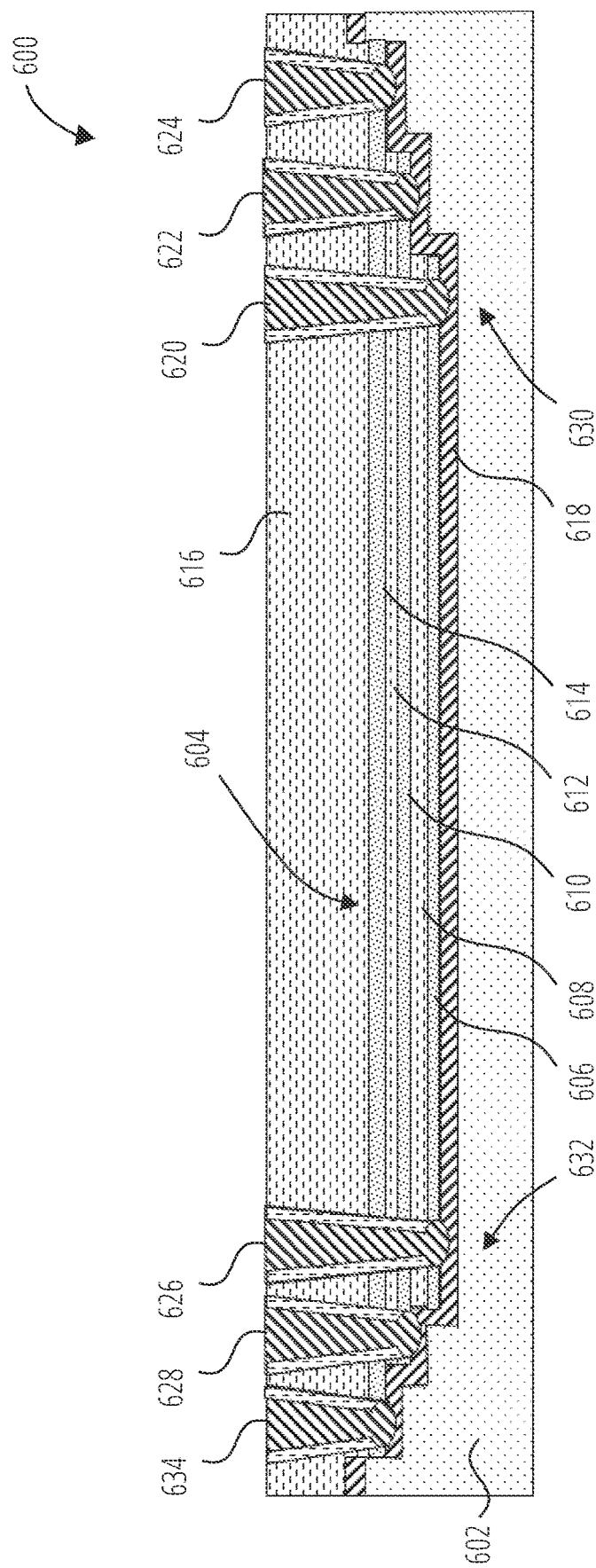
FIG. 6 is a longitudinal cross-sectional view of another resistor device, according to some embodiments.

FIG. 6 is a longitudinal cross-sectional view of another resistor device 600, according to some embodiments. The resistor device 600 is similar to the resistor device 100 of FIG. 1. For example, the resistor device 600 includes a substrate 602, a trench 604, a first electrically resistive material 606, a first electrically insulating material 608, a second electrically resistive material 610, a second electrically insulating material 612, a third electrically resistive material 614, a third electrically insulating material 616, an etch stop material 618, a first electrical contact 620, a second electrical contact 622, and a third electrical contact 624 similar to the substrate 102, the trench 104, the first electrically resistive material 106, the first electrically insulating material 108, the second electrically resistive material 110, the second electrically insulating material 112, the third electrically resistive material 114, the third electrically insulating material 116, the etch stop material 118, the first electrical contact 120, the second electrical contact 122, and the third electrical contact 124 of the resistor device 100 of FIG. 1. The resistor device 600 may be formed substantially as described above for the resistor device 100. In contrast to forming a single large contact aperture 240 to contact each of the electrically resistive materials 106, 110, and 114 at the second end 132 of the trench 104', as illustrated in FIG. 2R, however, separate contact apertures for the fourth electrical contact 626, the fifth electrical contact 628, and the sixth electrical contact 634 may be formed and the fourth electrical contact 626, the fifth electrical contact 628, and the sixth electrical contact 634 may be formed substantially similarly as described above for the first electrical contact 120, the second electrical contact 122, and the third electrical contact 124 of FIG. 1.

In contrast to the resistor device 100 of FIG. 1, which includes the fourth electrical contact 126 electrically connecting each of the first electrically resistive material 106, the second electrically resistive material 110, and the third electrically resistive material 114 together at the first end 130 of the trench 104, the resistor device 600 includes a fourth electrical contact 626, a fifth electrical contact 628, and a sixth electrical contact 634 at a second end 632 of the trench 604. The fourth electrical contact 626 is electrically connected to the first electrically resistive material 606, the fifth electrical contact 628 is electrically connected to the second electrically resistive material 610, and the sixth electrical contact 634 is electrically connected to the third electrically resistive material 614. As a result, the first electrically resistive material 606 may be electrically accessed at a first end 630 of the trench 604 via the first electrical contact 620 and at the second end 632 of the trench 604 via the fourth electrical contact 626. Also, the second electrically resistive material 610 may be electrically accessed at the first end 630 via the second electrical contact 622 and at the second end 632 via the fifth electrical contact 628. Similarly, the third electrically resistive material 614 may be electrically accessed at the first end 630 via the third electrical contact 624 and at the second end 632 via the sixth electrical contact 634.

The resistor device 600 may be implemented in various different manners. Similar to the resistor device 100 of FIG. 1, conductive traces may be used to hardwire the electrically resistive materials in various desired configurations. Also, switch circuitry may be used to selectively electrically connect the electrically resistive materials in various desired configurations. Since the electrically resistive materials are not all hardwired together (e.g., by an electrical contact similar to the fourth electrical contact 126 of FIG. 1), each of the electrically resistive materials may be individually electrically accessed, if desired. Also, the electrically resistive materials may be electrically connected in series with each other.

As discussed above for the resistor device 100 of FIG. 1, although the first electrically resistive material 606, the second electrically resistive material 610, and the third electrically resistive material 614 are illustrated as vertically stacked within the trench 604, in some embodiments the first electrically resistive material 606, the second electrically resistive material 610, and the third electrically resistive material 614 may instead be horizontally stacked within the trench 604.

Figure 7:
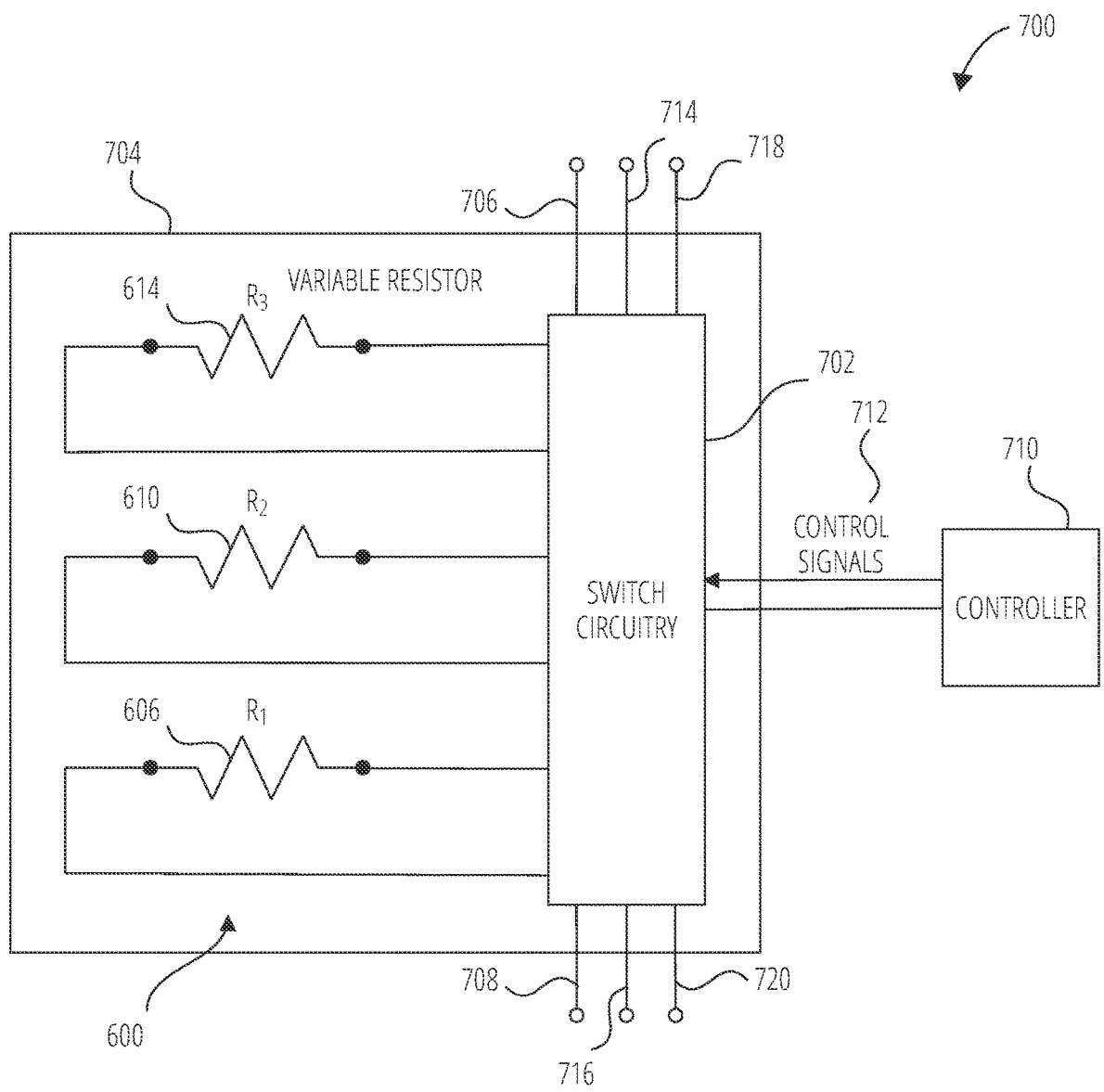
FIG. 7 is a block diagram of another electrical system including the resistor device of FIG. 6.

FIG. 7 is a block diagram of another electrical system 700 including the resistor device 600 of FIG. 6. The electrical system 700 is similar to the electrical system 300 of FIG. 3. For example, the electrical system 700 includes a variable resistor 704 and a controller 710 similar to the variable resistor 304 and the controller 310 of FIG. 3. The variable resistor 704 includes switch circuitry 702 similar to the switch circuitry 302 of FIG. 3. The variable resistor 704, however, includes the resistor device 600, which is different from the resistor device 100 of the variable resistor 304 of FIG. 3 because the first electrically resistive material 606, the second electrically resistive material 610, and the third electrically resistive material 614 are not hardwired together at one end as are the first electrically resistive material 106, the second electrically resistive material 110, and the third electrically resistive material 114 of the resistor device 100. Also, the variable resistor 704 includes multiple resistor terminals including a first resistor terminal 706, a second resistor terminal 708, a third resistor terminal 714, a fourth resistor terminal 716, a fifth resistor terminal 718, and a sixth resistor terminal 720 in contrast to the two resistor terminals (the first resistor terminal 306 and the second resistor terminal 308) of the variable resistor 304 of FIG. 3.

Similar to the controller 310 of FIG. 3, the controller 710 is configured to provide control signals 712 to control electrical resistances between resistor terminals of the variable resistor 704. A total resistance of the variable resistor 704 between any two of the resistor terminals may be electrically controlled responsive to the control signals 712 to be any one of the first electrically resistive material 606, the second electrically resistive material 610, and the third electrically resistive material 614, or any series and/or parallel combination of the first electrically resistive material 606, the second electrically resistive material 610, and the third electrically resistive material 614. By way of non-limiting example, any of the total resistance values discussed above for the variable resistor 304 of FIG. 3 may be achieved between any two of the resistor terminals of the variable resistor 704 of FIG. 7. In addition, since the first electrically resistive material 606, the second electrically resistive material 610, and the third electrically resistive material 614 are not hardwired together at an end, the switch circuitry 702 is capable of electrically connecting each of the first electrically resistive material 606, the second electrically resistive material 610, and the third electrically resistive material 614 in series between any two of the resistor terminals, resulting in a total resistance of $R_1+R_2+R_3$, where $R_1$ corresponds to the first electrically resistive material 606, $R_2$ corresponds to the second electrically resistive material 610, and $R_3$ corresponds to the third electrically resistive material 614.

In addition, all three of the first electrically resistive material 606, the second electrically resistive material 610, and the third electrically resistive material 614 may be separately used at the same time. By way of non-limiting example, responsive to one of the control signals 712, the switch circuitry 702 may electrically connect the first electrically resistive material 606 between the first resistor terminal 706 and the second resistor terminal 708, the second electrically resistive material 610 between the third resistor terminal 714 and the fourth resistor terminal 716, and the third electrically resistive material 614 between the fifth resistor terminal 718 and the sixth resistor terminal 720. As a result, an electrical resistance of $R_1$ may be provided between the first resistor terminal 706 and the second resistor terminal 708, an electrical resistance of $R_2$ may be provided between the third resistor terminal 714 and the fourth resistor terminal 716, and an electrical resistance of $R_3$ may be provided between the fifth resistor terminal 718 and the sixth resistor terminal 720.

Figure 8:
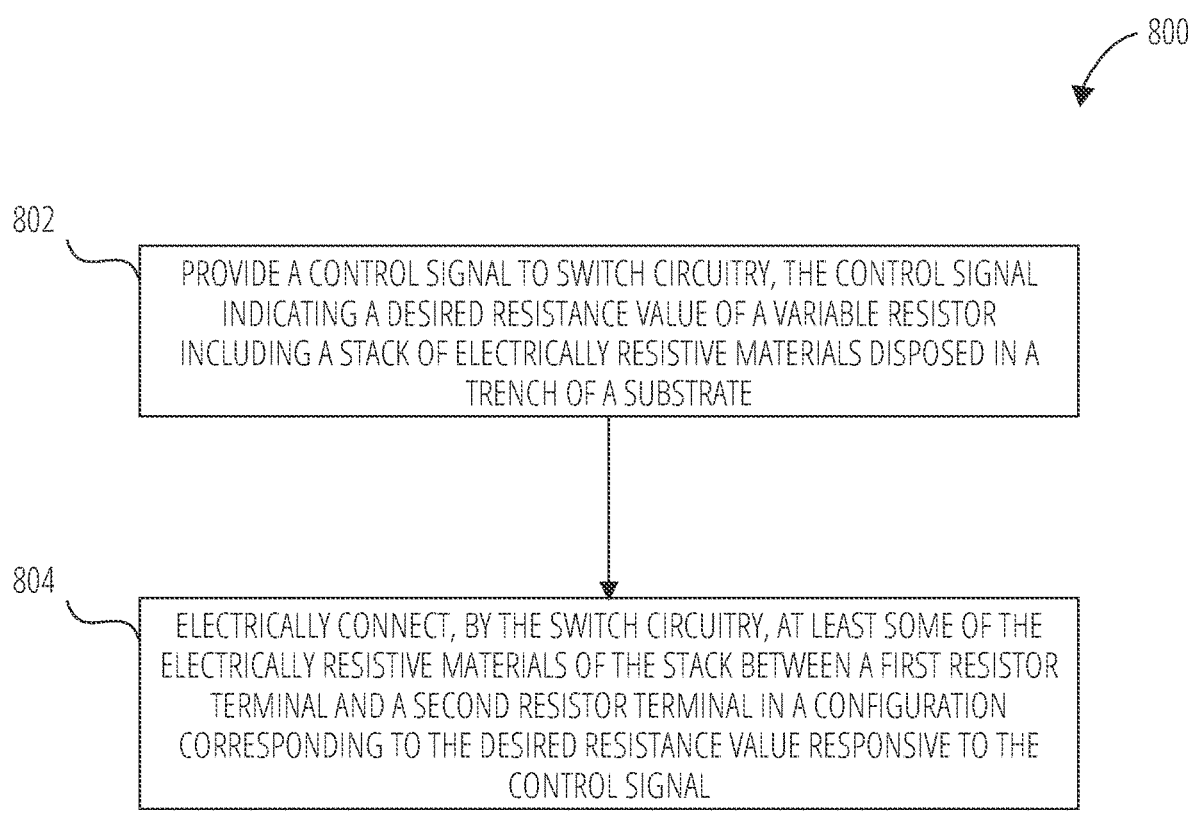
FIG. 8 is a flowchart illustrating a method of operating an electrical system, according to some embodiments.

FIG. 8 is a flowchart illustrating a method 800 of operating an electrical system (e.g., the electrical system 300 of FIG. 3, the electrical system 700 of FIG. 7), according to some embodiments. At operation 802 the method 800 includes providing a control signal to switch circuitry, the control signal indicating a desired resistance value of a variable resistor including a stack of electrically resistive materials disposed in a trench of a substrate. By way of non-limiting examples, the stack of electrically resistive materials may be similar to the resistor device 100 of FIG. 1 or the resistor device 600 of FIG. 6.

At operation 804 the method 800 includes electrically connecting, by the switch circuitry, at least some of the electrically resistive materials of the stack between a first resistor terminal and a second resistor terminal in a configuration corresponding to the desired resistance value responsive to the control signal.

Figure 9:
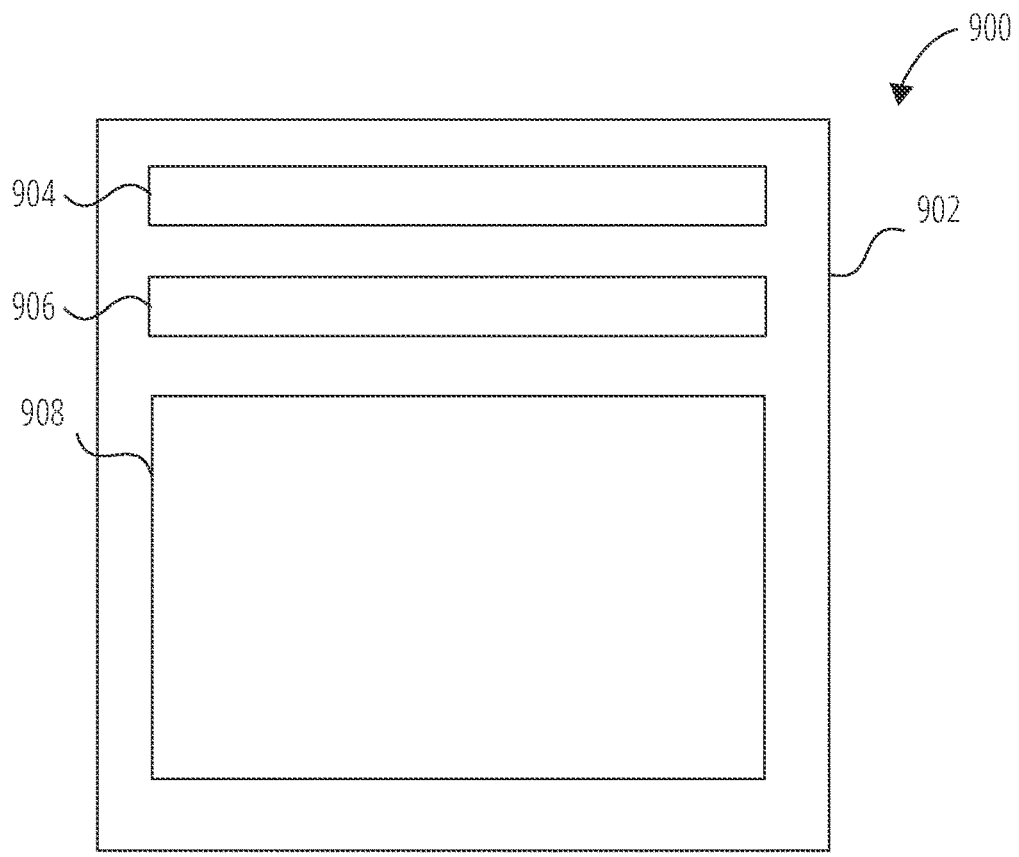
FIG. 9 is a plan view of an integrated circuit device, according to some embodiments.

FIG. 9 is a plan view of an integrated circuit device 900, according to some embodiments. The integrated circuit device 900 includes a semiconductor chip 902 including at least a first resistor device 904 and a second resistor device 906. The first resistor device 904 and the second resistor device 906 may each include a stack of electrically resistive materials in a trench defined by a substrate according to embodiments disclosed herein. By way of non-limiting examples, the first resistor device 904 and the second resistor device 906 may each include one of the resistor device 100 of FIG. 1, the resistor device 400 of FIG. 4, or the resistor device 600 of FIG. 6. Also by way of non-limiting examples, the first resistor device 904 and the second resistor device 906 may include stacks of electrically resistive materials similar to those of the resistor device 100, the resistor device 400, or the resistor device 600 except that the stacks may be horizontally oriented rather than vertically oriented within their trenches.

The semiconductor chip 902 also includes other circuitry 908. Since the first resistor device 904 and the second resistor device 906 are more horizontally compact than conventional horizontal serpentine resistors, the semiconductor chip 902 may be smaller and/or the other circuitry 908 may occupy a greater amount of chip area of the semiconductor chip 902 than if the first resistor device 904 and the second resistor device 906 were horizontal serpentine resistors.

In some embodiments the other circuitry 908 may include a controller and switch circuitry to implement variable resistors including the first resistor device 904 and/or the second resistor device 906, as discussed above with reference to FIG. 3 and FIG. 7. In some embodiments a separate integrated circuit device (not shown) and/or a separate semiconductor chip (not shown) may include a controller and/or switch circuitry to implement variable resistors including the first resistor device 904 and/or the second resistor device 906.

Figure 10:
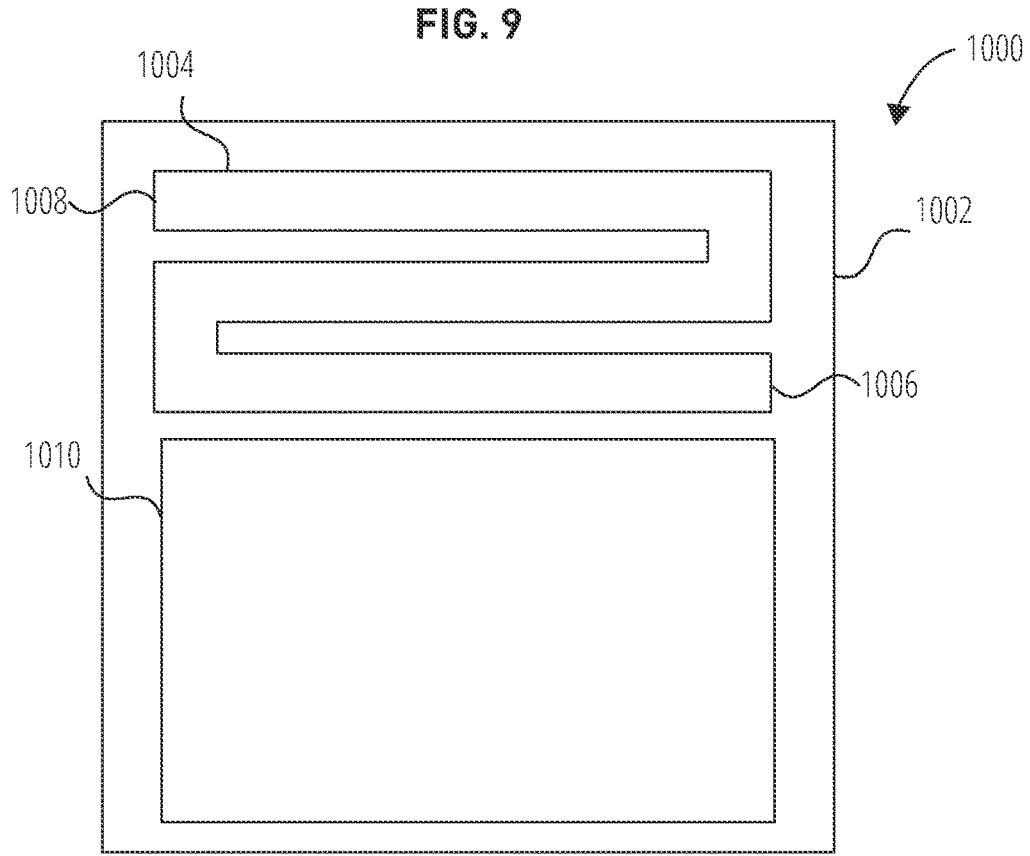
FIG. 10 is a plan view of another integrated circuit device, according to some embodiments.

FIG. 10 is a plan view of another integrated circuit device 1000, according to some embodiments. The integrated circuit device 1000 includes a semiconductor chip 1002 including at least a resistor device 1004. The resistor device 1004 is similar to the first resistor device 904 and the second resistor device 906 of FIG. 9 except the resistor device 1004 is configured in a horizontal meandering pattern across the semiconductor chip 1002 from a first end 1006 to a second end 1008. Accordingly, the resistor device 1004 may include a stack (e.g., a vertical stack or a horizontal stack) of electrically resistive materials in a meandering trench that meanders from the first end 1006 to the second end 1008.

In embodiments where the resistor device 1004 includes a vertically meandering serpentine resistor similar to the resistor device 400 of FIG. 4, the resistor device 1004 may meander in both vertical and horizontal directions. Accordingly, a relatively high resistance value of the resistor device 1004 may be achieved as compared to a conventional serpentine resistor that meanders only in the horizontal direction.

The semiconductor chip 1002 also includes other circuitry 1010 similar to the other circuitry 908 discussed above with reference to FIG. 9. In some embodiments the other circuitry 1010 may include switch circuitry and/or a controller to implement a variable resistor using the resistor device 1004, similar to the variable resistor 304 of FIG. 3 or the variable resistor 704 of FIG. 7.

Figure 11:
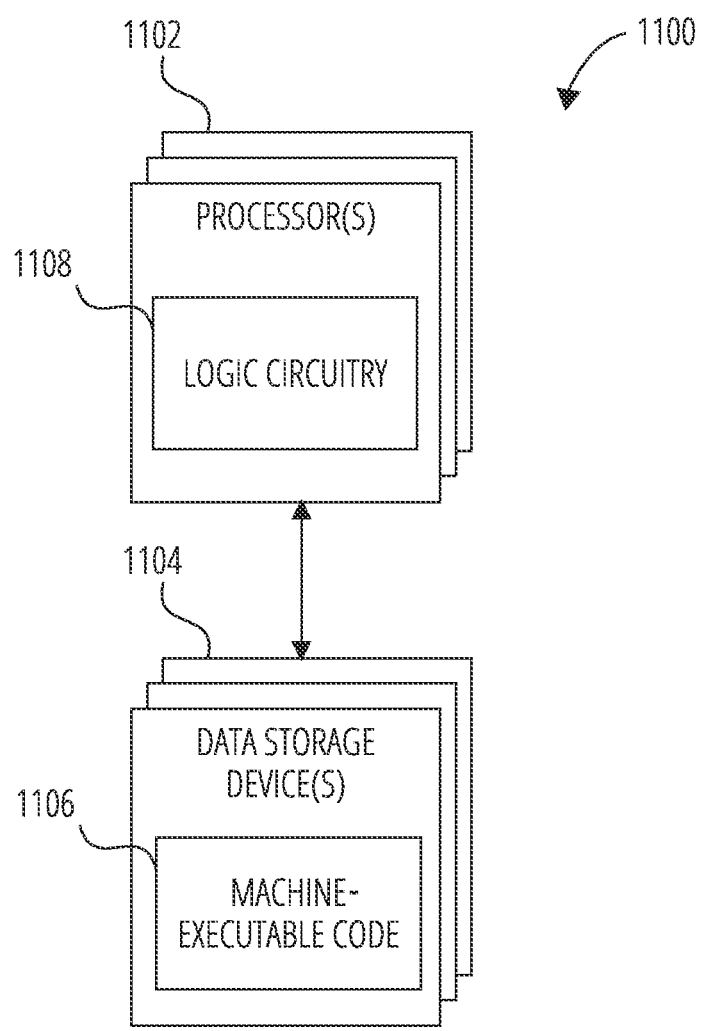
FIG. 11 is a block diagram of circuitry that, in some embodiments, may be used to implement various functions, operations, acts, processes, and/or methods disclosed herein.

It will be appreciated by those of ordinary skill in the art that functional elements of embodiments disclosed herein (e.g., functions, operations, acts, processes, and/or methods) may be implemented in any suitable hardware, software, firmware, or combinations thereof. FIG. 11 illustrates non-limiting examples of implementations of functional elements disclosed herein. In some embodiments, some or all portions of the functional elements disclosed herein may be performed by hardware specially configured for carrying out the functional elements.

FIG. 11 is a block diagram of circuitry 1100 that, in some embodiments, may be used to implement various functions, operations, acts, processes, and/or methods disclosed herein. The circuitry 1100 includes one or more processors (sometimes referred to herein as "processors 1102") operably coupled to one or more data storage devices (sometimes referred to herein as "storage 1104"). The storage 1104 includes machine-executable code 1106 stored thereon and the processors 1102 include logic circuitry 1108. The machine-executable code 1106 includes information describing functional elements that may be implemented by (e.g., performed by) the logic circuitry 1108. The logic circuitry 1108 is adapted to implement (e.g., perform) the functional elements described by the machine-executable code 1106. The circuitry 1100, when executing the functional elements described by the machine-executable code 1106, should be considered as special purpose hardware configured for carrying out functional elements disclosed herein. In some embodiments the processors 1102 may be configured to perform the functional elements described by the machine-executable code 1106 sequentially, concurrently (e.g., on one or more different hardware platforms), or in one or more parallel process streams.

When implemented by logic circuitry 1108 of the processors 1102, the machine-executable code 1106 is configured to adapt the processors 1102 to perform operations of embodiments disclosed herein. For example, the machine-executable code 1106 may be configured to adapt the processors 1102 to perform at least a portion or a totality of the method 800 of FIG. 8. As another example, the machine-executable code 1106 may be configured to adapt the processors 1102 to perform at least a portion or a totality of the operations discussed for the controller 310 of FIG. 3 and/or the controller 710 of FIG. 7. As a specific, non-limiting example, the machine-executable code 1106 may be configured to adapt the processors 1102 to provide control signals to switch circuitry to electrically connect one or more electrically resistive materials between resistor terminals in a configuration to achieve a desired resistance between the resistor terminals.

The processors 1102 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute functional elements corresponding to the machine-executable code 1106 (e.g., software code, firmware code, hardware descriptions) related to embodiments of the present disclosure. It is noted that a general-purpose processor (may also be referred to herein as a host processor or simply a host) may be a microprocessor, but in the alternative, the processors 1102 may include any conventional processor, controller, microcontroller, or state machine. The processors 1102 may also be implemented as a combination of computing devices, such as a combination of a DSP and a microprocessor, a plurality of microprocessors, one or more microprocessors in conjunction with a DSP core, or any other such configuration.

In some embodiments the storage 1104 includes volatile data storage (e.g., random-access memory (RAM)), non-volatile data storage (e.g., Flash memory, a hard disc drive, a solid state drive, erasable programmable read-only memory (EPROM), etc.). In some embodiments the processors 1102 and the storage 1104 may be implemented into a single device (e.g., a semiconductor device product, a system on chip (SOC), etc.). In some embodiments the processors 1102 and the storage 1104 may be implemented into separate devices.

In some embodiments the machine-executable code 1106 may include computer-readable instructions (e.g., software code, firmware code). By way of non-limiting example, the computer-readable instructions may be stored by the storage 1104, accessed directly by the processors 1102, and executed by the processors 1102 using at least the logic circuitry 1108. Also by way of non-limiting example, the computer-readable instructions may be stored on the storage 1104, transferred to a memory device (not shown) for execution, and executed by the processors 1102 using at least the logic circuitry 1108. Accordingly, in some embodiments the logic circuitry 1108 includes electrically configurable logic circuitry 1108.

In some embodiments the machine-executable code 1106 may describe hardware (e.g., circuitry) to be implemented in the logic circuitry 1108 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, Verilog™, System Verilog™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 1108 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some embodiments the machine-executable code 1106 may include an HDL, an RTL, a GL description, a mask level description, other hardware description, or any combination thereof.

In embodiments where the machine-executable code 1106 includes a hardware description (at any level of abstraction), a system (not shown, but including the storage 1104) may be configured to implement the hardware description described by the machine-executable code 1106. By way of non-limiting example, the processors 1102 may include a programmable logic device (e.g., an FPGA or a PLC) and the logic circuitry 1108 may be electrically controlled to implement circuitry corresponding to the hardware description into the logic circuitry 1108. Also by way of non-limiting example, the logic circuitry 1108 may include hard-wired logic manufactured by a manufacturing system (not shown, but including the storage 1104) according to the hardware description of the machine-executable code 1106.

Regardless of whether the machine-executable code 1106 includes computer-readable instructions or a hardware description, the logic circuitry 1108 is adapted to perform the functional elements described by the machine-executable code 1106 when implementing the functional elements of the machine-executable code 1106. It is noted that although a hardware description may not directly describe functional elements, a hardware description indirectly describes functional elements that the hardware elements described by the hardware description are capable of performing.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventors.

What is claimed is:

1. An apparatus, comprising:
    one or more resistor devices comprising:
        a substrate including a semiconductor material, a stepped trench defined in the substrate by sidewalls and horizontal surfaces of the semiconductor material;
        a first electrically resistive material within the stepped trench;
        a second electrically resistive material within the stepped trench;
        an electrically insulating material between the first electrically resistive material and the second electrically resistive material; and
        at least one electrical contact electrically connected to at least one end of the first electrically resistive material or the second electrically resistive material.

2. The apparatus of claim 1, wherein at least one of the first electrically resistive material and the second electrically resistive material includes a polycrystalline semiconductor material.

3. The apparatus of claim 1, wherein at least one of the first electrically resistive material and the second electrically resistive material includes polycrystalline silicon.

4. The apparatus of claim 1, wherein the one or more resistor devices further comprise an etch stop material within the stepped trench between the substrate and the first electrically resistive material and the second electrically resistive material.

5. The apparatus of claim 1, wherein the first electrically resistive material is electrically connected to the second electrically resistive material at one end of the stepped trench.

6. The apparatus of claim 1, wherein the one or more resistor devices further comprise:
    a third electrically resistive material within the stepped trench; and
    another electrically insulating material between the second electrically resistive material and the third electrically resistive material.

7. The apparatus of claim 1, wherein the substrate is terraced at one or more ends, the one or more terraced ends configured to accommodate the electrical connection of the first electrically resistive material and the second electrically resistive material through the at least one electrical contact.

8. The apparatus of claim 1, wherein the substrate is terraced at both ends.

9. The apparatus of claim 1, wherein the first electrically resistive material and the second electrically resistive material are arranged in a vertically oriented stack of electrically resistive materials within the stepped trench.

10. The apparatus of claim 1, wherein the first electrically resistive material and the second electrically resistive material are arranged in a horizontally oriented stack of electrically resistive materials within the stepped trench.

11. The apparatus of claim 1, wherein the first electrically resistive material has a different cross-sectional area from a cross-sectional area of the second electrically resistive material.

12. The apparatus of claim 1, wherein the first electrically resistive material has a cross-sectional area that is substantially the same as a cross-sectional area of the second electrically resistive material.

13. The apparatus of claim 1, wherein a first electrical resistance of the first electrically resistive material is substantially the same as a second electrical resistance of the second electrically resistive material.

14. The apparatus of claim 1, wherein a first electrical resistance of the first electrically resistive material is different from a second electrical resistance of the second electrically resistive material.

15. The apparatus of claim 1, wherein a first dopant concentration of the first electrically resistive material is substantially the same as a second dopant concentration of the second electrically resistive material.

16. The apparatus of claim 1, wherein a first dopant concentration of the first electrically resistive material is different from a second dopant concentration of the second electrically resistive material.

17. The apparatus of claim 1, wherein the at least one electrical contact comprises a first conductive via electrically connecting the first electrically resistive material to the second electrically resistive material at a first end of the stepped trench.

18. The apparatus of claim 17, wherein the one or more resistor devices further comprise:
a third electrically resistive material within the stepped trench;
another electrically insulating material between the second electrically resistive material and the third electrically resistive material; and
a second conductive via electrically connecting the second electrically resistive material to the third electrically resistive material at a second end of the stepped trench.

19. An apparatus, comprising:
one or more resistor devices comprising:
a substrate including a semiconductor material, a stepped trench defined in the substrate by sidewalls and horizontal surfaces of the semiconductor material;
a first electrically resistive material within the stepped trench and vertically adjacent to the semiconductor material;
a second electrically resistive material within the stepped trench and vertically adjacent to the first electrically resistive material, the first electrically resistive material between the semiconductor material and the second electrically resistive material;
an electrically insulating material between the first electrically resistive material and the second electrically resistive; and
at least one electrical contact electrically connected to at least one end of the first electrically resistive material or the second electrically resistive material.

20. The apparatus of claim 19, wherein the one or more resistor devices further comprise a third electrically resistive material within the stepped trench, the second electrically resistive material between the first electrically resistive material and the third electrically resistive material.

21. The apparatus of claim 20, wherein the at least one electrical contact comprises:
a first electrical contact electrically connected to a first end of the first electrically resistive material;
a second electrical contact electrically connected to a first end of the second electrically resistive material;
a third electrical contact electrically connected to a first end of the third electrically resistive material; and
a fourth electrical contact electrically connected to second ends of the first electrically resistive material, the second electrically resistive material, and the third electrically resistive material.

22. The apparatus of claim 21, further comprising switch circuitry electrically connected to the first electrical contact, the second electrical contact, the third electrical contact, and the fourth electrical contact, the switch circuitry configured to implement a variable resistor including one or more of the first electrically resistive material, the second electrically resistive material, and the third electrically resistive material responsive to one or more control signals.

23. The apparatus of claim 22, further comprising a controller configured to provide the one or more control signals to the switch circuitry.

24. A method of operating an electrical system, the method comprising:
providing a control signal to switch circuitry, the control signal indicating a desired resistance value of a variable resistor including a stack of electrically resistive materials disposed in a stepped trench of a substrate, and at least one electrical contact electrically connected to at least one end of at least one electrically resistive material of the stack; and
electrically connecting, by the switch circuitry, at least some of the electrically resistive materials of the stack between a first resistor terminal and a second resistor terminal in a configuration corresponding to the desired resistance value responsive to the control signal.

* * * * *

UNITED STATES PATENT AND TRADEMARK OFFICE
CERTIFICATE OF CORRECTION

Page 1 of 1

PATENT NO. : 12,148,789 B2
APPLICATION NO. : 17/214322
DATED : November 19, 2024
INVENTOR(S) : Ahmed N. Noemaun and Durga P. Panda It is certified that error appears in the above-identified patent and that said Letters Patent is hereby corrected as shown below:

In the Specification

Column 10, Lines 22-23, change "using an oxygen (02) treatment" to --using an oxygen ($O_2$) treatment--

Signed and Sealed this
Seventh Day of January, 2025

Derrick Brent
*Acting Director of the United States Patent and Trademark Office*